United States Patent [19]

Nishizawa et al.

[11] Patent Number: 5,323,028

[45] Date of Patent: Jun. 21, 1994

[54] MOS COMPOSITE STATIC INDUCTION THYRISTOR

[75] Inventors: Jun-ichi Nishizawa; Sohbe Suzuki, both of Sendai, Japan

[73] Assignee: Zaidan Hojin Handotai Kenkyu Shinkokai, Sendai, Japan

[21] Appl. No.: 947,939

[22] Filed: Sep. 21, 1992

[30] Foreign Application Priority Data

Jan. 16, 1992 [JP] Japan .................................. 4-025637

[51] Int. Cl.$^5$ ...................... H01L 29/72; H01L 29/76
[52] U.S. Cl. ..................................... 257/136; 257/262; 257/265; 257/272; 257/264; 257/498; 307/630
[58] Field of Search ............... 257/262, 265, 498, 272, 257/264, 136, 146; 307/630

[56] References Cited

U.S. PATENT DOCUMENTS 4,985,738 1/1991 Nishizawa et al. ................. 257/136

FOREIGN PATENT DOCUMENTS 3838962 6/1989 Fed. Rep. of Germany .
2-26276 1/1990 Japan .
3-18054 1/1991 Japan .................................. 257/262

OTHER PUBLICATIONS

"A New Bidirectional Solid-State Switch for Telephone Loop Plant Applications", Proceedings of the IEEE vol. 69, No. 3, Mar. 1981, pp. 292-299, Peter W. Shackle et al.

"Properties of a High-Power Field-Controlled Thyristor", International Electron Devices Meeting, 1986 Technical Digest, Dec. 1986, Los Angeles, Calif., pp. 110-113.

Primary Examiner—Jerome Jackson
Attorney, Agent, or Firm—Fish & Richardson

[57] ABSTRACT

In a MOS controlled power device, or MOS composite a static induction thyristor, an static induction thyristor (SI thyristor) unit, a MOS transistor connected in cascode relation to the SI thyristor unit and a voltage regulation element are merged onto the single monolithic chip. The SI thyristor unit has a cathode region of first conductivity type having high impurity concentration, an anode and a gate regions of second conductivity type having high impurity concentration, and a channel region of first conductivity type having low impurity concentration. The MOS transistor has a drain region which is the same region as the cathode region, a well or a base of second conductivity type formed adjacent to the channel region of the SI thyristor unit, and a source region of first conductivity type having high impurity concentration. The source region is formed within the well or above the base. The voltage regulation element comprises a first semiconductor region of second conductivity type, and a second semiconductor region of first conductivity type, both having high impurity concentration.

23 Claims, 20 Drawing Sheets

MOS COMPOSITE STATIC INDUCTION THYRISTOR

BACKGROUND OF THE INVENTION

The present invention relates to a novel structure of a static induction thyristor (hereinafter referred to as an "SI thyristor") and, more particularly, to a MOS composite static induction thyristor in which a MOS transistor, a diode and an SI thyristor are integrated onto a single monolithic chip.

In recent years, various MOS controlled power devices or MOS gated power devices such as MGT, MCT, EST, and DMT have been proposed. However, these MOS composite devices have, as a main thyristor unit, a conventional device such as GTO. Since ON-voltage of these MOS composite devices is finally determined by the characteristics of the main thyristor unit, prior art MOS composite devices having a conventional thyristor such as GTO has disadvantage that the ON-voltage and conduction loss are high. Further, these conventional MOS composite devices have the disadvantage that it is difficult to use the devices at high frequency.

In view of the above, a MOS composite SI thyristor, or MOS controlled SI thyristor (MCSITH), in which high efficiency and high-speed operation are expected and which comprises, as a main thyristor unit, an SI thyristor unit. Having low ON-voltage and conduction loss and high frequency operation and high speed switching, has already been proposed by the Applicant of the present invention in Japanese Patent Application No. HEI 2-95251 (Japanese Patent Laid-Open No. HEI 3-292770). The MCSITH has a structure in which a MOS transistor is integrated at a location between a gate and a cathode of a normally-off SI thyristor, as shown in FIG. 20 and FIG. 21 (a cross-sectional view taken along a line A—A in FIG. 20) of the attached drawings.

FIG. 20 is a top plan view, while FIG. 21 is a cross-sectional view taken along a line A—A in FIG. 20. As shown in FIGS. 20 and 21, an SI thyristor is formed in which an n+ region 23 is a cathode, a p+ region 21 is an anode, a p+ region 31 under a floating condition is a gate, and an n− region 22 is a channel. A p+ region 31 simultaneously serves as the source of the pMOS transistor in which a p+ region 32 is the drain and a polycrystalline silicon layer 25 is the gate electrode.

The MCSITH is turned on by a positive potential applied to the capacitance formed by the polycrystalline silicon layer 25 and an oxide film 26, which that is an insulating film provided above the p+ gate region 31 to reduce the height of a potential barrier formed in the n− channel region 22 by means of capacitive coupling (static induction effects). The MCSITH is turned off when the pMOS transistor is conducted to short-circuit the p+ gate region 31 to the n+ cathode region 23, to withdraw a hole through the p+ gate region 31.

However, this MCSITH has the following disadvantages. If the impurity concentration of the n− channel region 22 is brought to approximately $10^{13}$ cm$^{-3}$ to give the main thyristor unit a normally-off characteristic, the spacing between the adjacent p+ gate regions 31 must be equal to or less than approximately 6 μm. Assuming that the diffusion width of the n+ cathode stripped region 23 is 2 μm, the interval between the n+ cathode region 23 and the p+ gate region 31 must then be narrowed to 2 μm. Accordingly, a fine processing technique is required to merge a MOS transistor between the n+ cathode region 23 and the p+ gate region 31. For this reason, manufacturing is difficult, and a yield is low.

SUMMARY OF THE INVENTION

It is an object of the present invention to provide a MOS composite SI thyristor, having a novel structure, which has an essentially low ON-voltage and, therefore, a small conduction loss, which is easy to operate at a high frequency and a high speed and in which manufacturing is easy.

It is another object of the invention to provide a MOS composite SI thyristor having a novel structure, in which a gate loss can be reduced, and a gate drive circuit can be simplified.

According to the invention, there is provided a MOS composite SI thyristor comprising:

an SI thyristor unit having at least a cathode region of first conductivity type having high impurity concentration, an anode region and a pair of gate regions of second conductivity type having high impurity concentration, and a channel region of first conductivity type having low impurity concentration;

a MOS transistor having at least a drain region that is the same as the cathode region, a well of second conductivity type formed adjacent to the channel region, a source region of first conductivity type having high impurity concentration formed within the well, a gate insulating film formed on a surface of the well between the source region and the drain region, and a MOS gate electrode formed above the gate insulating film;

a voltage regulation element having a first semiconductor region of second conductivity type having high impurity concentration, and a second semiconductor region of first conductivity type having high impurity concentration;

wherein the SI thyristor unit, the MOS transistor and the voltage regulation element are integrated on the same monolithic chip.

wherein the MOS composite SI thyristor has at least a structure in which the first semiconductor region and the source region are connected to each other through a first wiring layer of high conductivity, and the second semiconductor region and the gate regions are connected to each other through a second wiring layer of high conductivity, and wherein control voltage is applied to the MOS gate electrode, so that the principal current flowing between the anode and cathode region is controlled.

According to the invention, there is further provided a MOS SI induction thyristor comprising:

an SI thyristor unit having at least a cathode region of first conductivity type having high impurity concentration, an anode region and a pair of gate regions of second conductivity type having high impurity concentration, and a channel region of first conductivity type having low impurity concentration;

a MOS transistor having at least a drain region that is the same region as the cathode region, a base of second conductivity type formed adjacent to the channel region, a source region of first conductivity type having high impurity concentration formed above the base, a gate insulating film formed on a surface of the base between the source and drain region, and a MOS gate electrode formed adjacent to the gate insulating film;

a voltage regulation element having a first semiconductor region of second conductivity type having high impurity concentration, and a second semiconductor region of first conductivity type having high impurity concentration;

wherein the SI thyristor unit, the MOS transistor and the voltage regulation element are integrated on the same monolithic chip, and wherein the MOS composite SI thyristor has at least a structure in which the first semiconductor region and the source region are connected to each other through a first wiring layer of high conductivity, and the second semiconductor region and the gate regions are connected to each other through a second wiring layer of high conductivity.

According to the invention, there is also provided a MOS composite SI thyristor comprising:

an SI thyristor unit having at least a cathode region of first conductivity type having high impurity concentration, an anode region and a pair of gate regions of second conductivity type having high impurity concentration, and a channel region of first conductivity type having low impurity concentration;

a MOS transistor having at least a drain region that is the same region as the cathode region, a well of second conductivity type formed adjacent to the channel region, a source region of first conductivity type having high impurity concentration formed within the well, a gate insulating film formed on a surface of the well between the source and the drain regions, and a MOS gate electrode formed above the gate insulating film;

a voltage regulation element having a first semiconductor region of second conductivity type having high impurity concentration, and a second semiconductor region of first conductivity type having high impurity concentration;

wherein the SI thyristor unit, the MOS transistor and the voltage regulation element are merged onto the single monolithic chip, wherein the first semiconductor region and the source region are connected to each other through a first wiring layer of high conductivity, and the second semiconductor region and the gate regions are connected to each other through a second wiring layer of high conductivity, wherein the MOS composite SI thyristor has at least a structure in which the MOS transistor is formed longitudinally along the long side of a planar pattern of the cathode region, and wherein control voltage is applied to the MOS gate electrode, so that current flowing between the anode area and the cathode area is controlled.

According to the invention, there is provided a MOS composite SI thyristor comprising:

an SI thyristor unit having at least a cathode region of first conductivity type having high impurity concentration, an anode region and gate regions of second conductivity type having high impurity concentration, and a channel region of first conductivity type having low impurity concentration;

a MOS transistor having at least a drain region that is the same region as the cathode region, a well of second conductivity type formed adjacent to the channel region, a source region of first conductivity type having high impurity concentration formed within the well, a gate insulating film formed on a surface of the well between the source and the drain regions, and a MOS gate electrode formed above the gate insulating film;

a voltage regulation element having a first semiconductor region of second conductivity type having high impurity concentration, and a second semiconductor region of first conductivity type having high impurity concentration;

wherein the SI thyristor unit, the MOS transistor and the voltage regulation element are merged onto the single monolithic chip, wherein the first semiconductor region and the source region are connected to each other through a first wiring layer of high conductivity, and the second semiconductor region and the gate region are connected to each other through a second wiring layer of high conductivity, wherein the MOS composite SI thyristor has at least a structure in which the gate regions are buried within the channel region, and wherein control voltage is applied to the MOS gate electrode, so that principal current flowing between the anode and cathode regions is controlled.

According to the invention, there is also provided a MOS composite SI thyristor comprising:

an SI thyristor unit having at least a cathode region of first conductivity type having high impurity concentration, an anode region and a pair of gate regions of second conductivity type having high impurity concentration, and a channel region of first conductivity type having low impurity concentration;

a MOS transistor having at least a drain region that is the same region as the cathode region, a base of second conductivity type formed adjacent to the channel region, a source region of first conductivity type having high impurity concentration formed above the base, a gate insulating film formed on a surface of the base between the source and the drain region, and a MOS gate electrode formed adjacent to the gate insulating film;

a voltage regulation element having a first semiconductor region of second conductivity type having high impurity concentration, and a second semiconductor region of first conductivity type having high impurity concentration;

wherein the SI thyristor, the MOS transistor and the voltage regulation element are merged onto the single monolithic chip, wherein the first semiconductor region and the source region are connected to each other through a first wiring layer of high conductivity, and the second semiconductor region and the gate regions are connected to each other through a second wiring layer of high conductivity, wherein the MOS composite SI thyristor has at least a pair of grooves, the gate regions are formed on bottoms of the grooves, and the cathode region is formed substantially at a center of an upper portion of the channel area which is sandwiched in between the grooves, and wherein control voltage is applied to the MOS gate electrode, so that current flowing between the anode and cathode regions is controlled.

According to the invention, there is further provided a MOS composite SI thyristor comprising:

an SI thyristor unit having at least a cathode region of first conductivity type having high impurity concentration, an anode region and gate regions of second conductivity type having high impurity concentration, and a channel region of first conductivity type having low impurity concentration;

a MOS transistor having at least a drain region that is the same region as the cathode region, a base of second conductivity type formed adjacent to the channel region, a source region of first conductivity type having high impurity concentration formed above the base, a gate insulating film formed on a surface of the base between the source and drain regions, and a MOS gate electrode formed adjacent to the gate insulating film;

a voltage regulation element having a first semiconductor region of second conductivity type having high impurity concentration, and a second semiconductor region of first conductivity type having high impurity concentration;

wherein the SI thyristor unit, the MOS transistor and the voltage regulation element are integrated on the same monolithic chip, wherein the first semiconductor region and the source region are connected to each other through a first wiring layer of high conductivity, and the second semiconductor region and the gate regions are connected to each other through a second wiring layer of high conductivity, wherein the MOS composite SI thyristor has at least a pair of grooves, the gate regions are formed on side walls of the grooves, and the cathode region is formed substantially at a center of an upper portion of the channel region which is sandwiched in between the grooves, and wherein control voltage is applied to the MOS gate electrode, so that current flowing between the anode and cathode regions is controlled.

According to the invention, there is further provided a MOS composite SI thyristor comprising:

a double gate SI thyristor unit having at least a cathode region and second gate regions of first conductivity type having high impurity concentration, an anode region and first gate regions of second conductivity type having high impurity concentration, and a channel region having low impurity concentration;

a MOS transistor having at least a drain region that is the same region as the anode region, a well of first conductivity type formed adjacent to the channel region, a source region of second conductivity type having high impurity concentration formed within the well, a gate insulating film formed on a surface of the well between the source and the drain regions, and a MOS gate electrode formed above the gate insulating film;

a voltage regulation element having a first semiconductor region of second conductivity type having high impurity concentration, and a second semiconductor region of first conductivity type having high impurity concentration;

wherein the SI thyristor unit, the MOS transistor and the voltage regulation element are merged onto the single monolithic chip, wherein the MOS composite SI thyristor has at least a structure in which the first semiconductor region and the second gate region are connected to each other through a first wiring layer of high conductivity, and the second semiconductor region and the source region are connected to each other through a second wiring layer of high conductivity, and wherein control voltage is applied to at least one of the MOS gate electrode and the gate region, so that current flowing between the anode and cathode regions is controlled.

According to the invention, there is provided a MOS composite SI thyristor comprising:

an SI thyristor unit having at least a cathode region of first conductivity type having high impurity concentration, an anode region and gate regions of second conductivity type having high impurity concentration, and a channel region of first conductivity type having low impurity concentration;

a first MOS transistor having at least a first drain region that is the same region as the cathode region, a first well of second conductivity type formed adjacent to the channel region, a first source region of first conductivity type having high impurity concentration formed within the first well, a first gate insulating film formed on a surface of the first well between the first source and the first drain regions, and a first MOS gate electrode formed above the first gate insulating film;

a second MOS transistor having at least a second drain region that is the same region as the gate regions, a second well of first conductivity type formed adjacent to the channel region, a second source region of second conductivity type having high impurity concentration formed within the second well, a second gate insulating film formed on a surface of the second well between the second source and drain region, and a second MOS gate electrode formed above the second gate insulating film;

a voltage regulation element having a first semiconductor region of second conductivity type having high impurity concentration, and a second semiconductor region of first conductivity type;

wherein the SI thyristor unit, the two MOS transistors and the voltage regulation element are integrated on the same monolithic chip, wherein the MOS composite SI thyristor has at least a structure in which the first semiconductor region, the first and second source regions are connected to each other through a first wiring layer of high conductivity, and the second semiconductor region and the gate regions are connected to each other through a second wiring layer of high conductivity, and wherein control voltage is applied to the first and second MOS gate electrode, so that current flowing between the anode and cathode regions is controlled.

According to the invention, there is further provided a MOS composite SI thyristor comprising:

an SI thyristor unit having at least a cathode region of first conductivity type having high impurity concentration, an anode region and gate regions of second conductivity type having high impurity concentration, and a channel region of first conductivity type having low impurity concentration;

a first MOS transistor having at least a first drain region that is the same region as the cathode region, a first base of second conductivity type formed adjacent to the channel region, a first source region of first conductivity type having high impurity concentration formed above the first base, a first gate insulating film formed on a surface of the first base between the first source and drain regions, and a first MOS gate electrode formed adjacent to the first gate insulating film;

a second MOS transistor having at least a drain region that is the same region as the gate region, a second base of first conductivity type formed adjacent to an upper portion of the second drain region, a second source region of second conductivity type having high impurity concentration formed above the second base, a second gate insulating film formed on a surface of the second base between the second source and drain region, and a second MOS gate electrode formed adjacent to the second gate insulating film;

a voltage regulation element having a first semiconductor region of second conductivity type having high impurity concentration, and a second semiconductor region of first conductivity type;

wherein the SI thyristor unit, the two MOS transistor and the voltage regulation element are integrated on the same monolithic chip, wherein the MOS composite SI thyristor has at least a structure in which the first semiconductor region, the first and second source regions are connected to each other through a first wiring layer of high conductivity, and the second semiconductor region and the gate regions are connected to each other through a second wiring layer of high conductivity, and wherein control voltage is applied to the first and second MOS gate electrode, so that current flowing between the anode and cathode regions is controlled.

With the above arrangement of the invention, since the MOS transistor is integrated on the single monolithic chip by cascode connection, inductance of the wiring can be reduced and, as a result, extremely high speed switching is made possible. Further, since an SI thyristor unit having a normally-on characteristics between normally-on and normally-off characteristics can be employed as the main thyristor unit, it is possible to make the gate interval wide. Since it is easy to merge the MOS transistor at the wide space in the gate interval, manufacturing is easy, and device yield is high. Moreover, since the SI thyristor unit can be driven without the use of both positive and negative power sources for the trigger pulse and the quench pulse respectively, the gate drive circuit can be simplified. Furthermore, since the MOS gate terminal of composite devices and the gate regions of the main thyristor unit are electrically separated from each other by the MOS transistor, the gate loss of the SI thyristor unit is extremely reduced. Needless to say, since the SI thyristor unit is the main thyristor unit, the above arrangement has essentially low ON-voltage and, accordingly, small conduction loss and is easily brought to high frequency operation.

Though the SI thyristor unit employed is a normally-on type or approximately between a normally-on and normally-off type employed, the normally-off characteristic as a whole is obtained, while the large power handling capability and low ON-resistance characteristic of the normally-on SI thyristor are still maintained. The MOS composite SI thyristor according to the present invention is very conveniently applied to various circuits as an inverter.

In connection with the above, it is possible to use the normally-off SI thyristor unit, if the latter is superior in trigger sensitivity. However, the deep normally-off type with very narrow gate interval, which is strong in off-characteristic, is inadequate, since the turning-off time is lengthened or the SI thyristor cannot be turned off at all.

As described above, the MOS composite SI thyristor according to the present invention has the practical advantages that manufacturing is easy, switching speed is high, gate loss can be reduced, and a gate drive circuit can be simplified.

DESCRIPTION OF THE EMBODIMENTS

Various embodiments of the invention will hereunder be described in detail with reference to the accompanying drawings.

Figure 1:
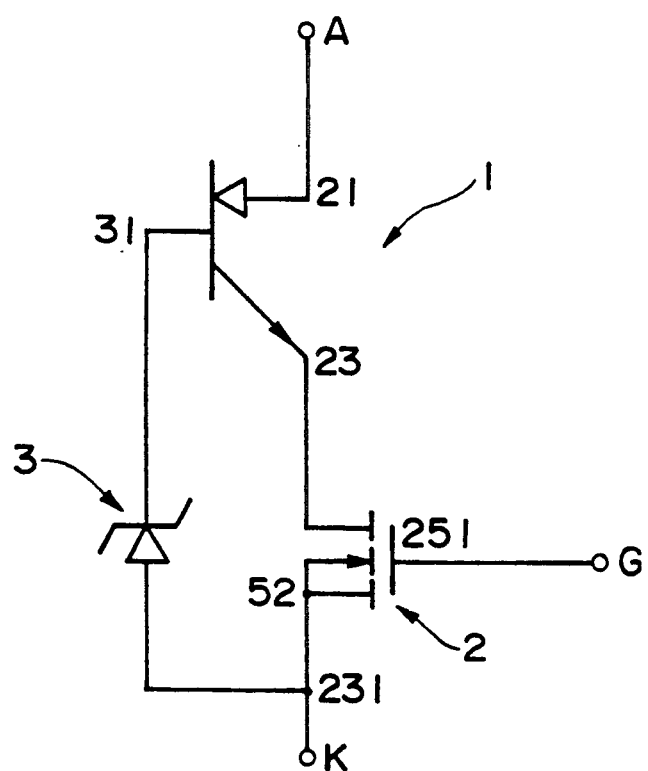
FIG. 1 is a circuit diagram of a first embodiment of a MOS composite SI thyristor according to the present invention, which shows a cascode connection of a SI thyristor and a MOS transistor.
Figure 2:
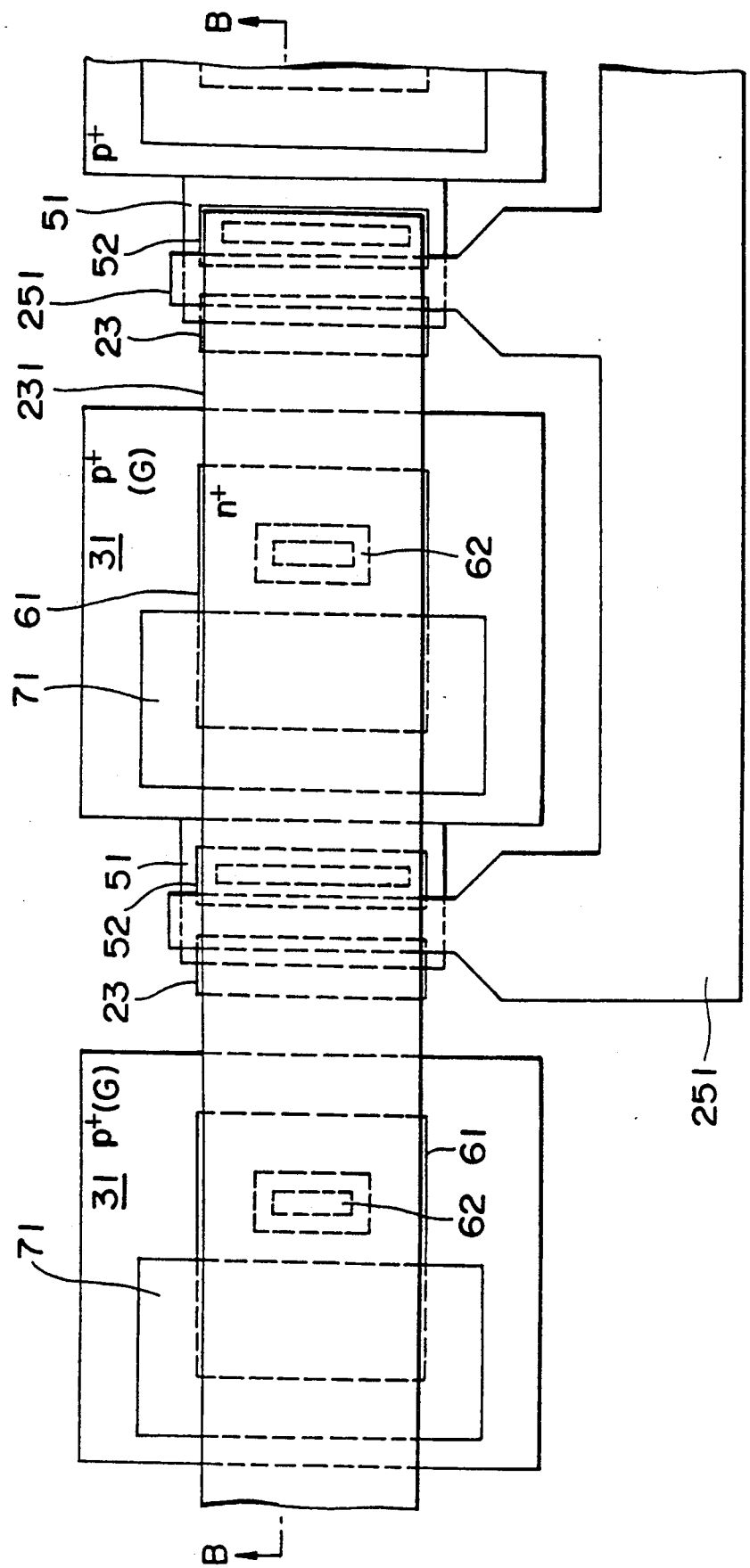
FIG. 2 is a top plan view showing a specific or exemplified structure into which the first embodiment is integrated.
Figure 3:
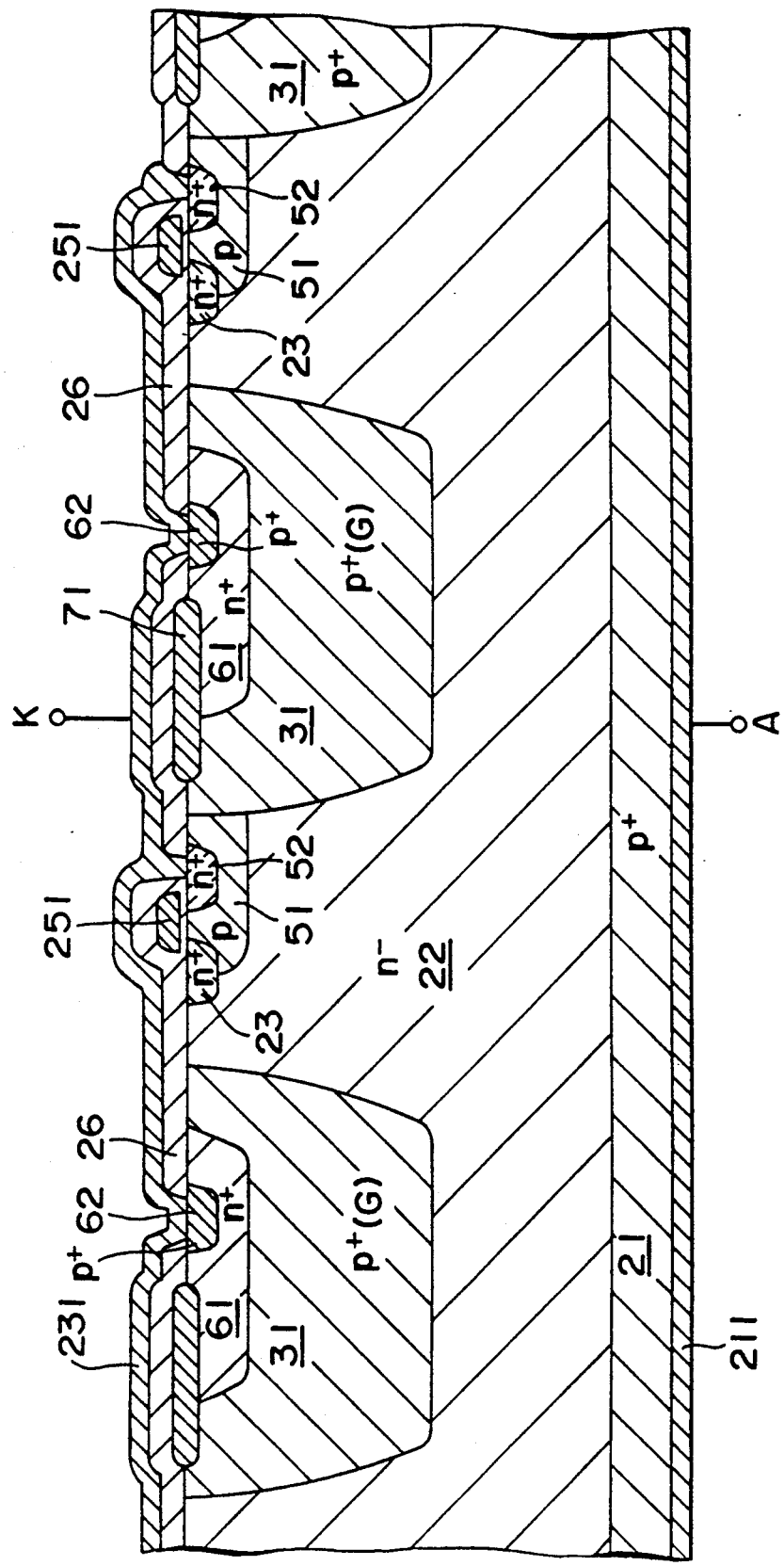
FIG. 3 is a cross-sectional view taken along a line B—B in FIG. 2.

FIG. 1 is a circuit diagram of a first embodiment of a MOS composite SI thyristor according to the present invention, and FIG. 2 is a top plan view showing a specific structure into which the MOS transistor, SI thyristor unit and diode are integrated, while FIG. 3 is a cross-sectional view taken along a line B—B in FIG. 2.

As shown in FIG. 1, the MOS composite SI thyristor is arranged as follows. An SI thyristor unit 1 has a cathode 23 to which a drain of a MOS transistor (n-channel MOS transistor) is connected in series, or in cascode relation. The SI thyristor unit 1 has a gate 31 to which a source 52 of a MOS transistor 2 is connected through a voltage regulation element such as a Zener diode 3. The SI thyristor unit 1, the MOS transistor and the Zener diode 3 are merged onto a single monolithic chip.

As shown in FIGS. 2 and 3, a cathode region of the SI thyristor unit 1 and a drain region of the n-channel MOS transistor 2 are merged into the same $n^+$ region 23. A p+ region 21, the p+ region 31 and an n− region 22 are the anode, the gate and the channel region of the SI thyristor unit 1, respectively. Each of the n+ regions 52 is a source region of the MOS transistor 2 and is formed within a corresponding p-well 51. Further, a polycrystalline silicon layer 251 is a gate electrode of the MOS transistor 2 whose gate oxide film is a thin portion of each of oxide films 26.

Further, a p-n junction Zener diode 3 consisting of P+ region 62 and n+ region 61 is used as a voltage regulation element. In this embodiment, however, the Zener diode 3 is formed within each of the p+ gate regions 31. The n+ region 61 of the Zener diode and the p+ gate region 31 are short-circuited to each other through a silicide film 71 made of a refractory metal such as $WSi_2$, $TiSi_2$. The silicide film 71 also reduces a resistance of the p+ gate region 31. The reference numeral 211 denotes an anode electrode, while 231 denotes a cathode electrode.

The present embodiment is constructed as described above. Accordingly, when positive potential is applied to the p+ anode region 21, voltage ($V_{nMOS}$) between the drain and the source of the MOS transistor 2 rises. The following difference between the above voltage ($V_{nMOS}$) and the Zener voltage ($V_{ZD}$):

$$V_{GK} = V_{nMOS} - V_{ZD}$$

is applied to a location between the gate region 31 and the cathode region 23 of the SI thyristor as a reverse bias. Even if the SI thyristor unit 1 has a normally-on characteristic, the SI thyristor indicates a normally-off characteristic as a whole. When positive voltage equal to or more than a threshold value is applied to the gate electrode 251 of the MOS transistor 2, the MOS transistor 2 is shifted from the off-state to the on-state, and a value of $V_{nMOS}$ is reduced during the process of the shifting. Simultaneously therewith, $V_{GK}$ ($=V_{nMOS}-V_{ZD}$) is also reduced and, accordingly, voltage capable of being blocked by the SI thyristor is reduced. From the time $V_{nMOS}$ is reduced to a minimum value, $V_{GK}$ becomes negative. Since the location between the gate area 31 and the cathode area 23 of the SI thyristor unit 1 is forward-biased, the SI thyristor unit 1 is turned on.

Next, when an off-bias is applied to the gate 251 of the MOS transistor 2, the MOS transistor 2 is first turned off. Then, $V_{nMOS}$ rises, and terminal voltage between the gate area 31 and the cathode area 23 is reversely biased. Simultaneously, the main current flowing from the anode area 21, via the cathode area 23 and the source area 52 of the MOSFET, to the cathode electrode 231 changes to flow through the gate area 31 of the SI thyristor unit 1 and the Zener diode 3, so that the SI thyristor unit 1 is turned off.

Operation principle of the present embodiment has been described above. Since, however, the present embodiment is arranged such that the MOS transistor 2 is merged onto a single monolithic chip by cascode connection, inductance of the wiring can be reduced and, as a result, extremely high speed switching is possible. Further, since the SI thyristor unit 1 has a characteristic of the normally-on or between the normally-on and the normally-off type and serves as the main thyristor unit, it is possible to widen the gate spacing of the SI thyristor. Since it is easy to form the MOS transistor 2 at the wide portion of the gate interval, manufacturing is easy, and device yield is high. Moreover, since the SI thyristor unit 1 can be driven without using both positive and negative power sources for a trigger and a quench pulse respectively, a gate drive circuitry can be simplified. Further, since the gate terminal 251 of this MOS composite devices and the gate region 31 of a main thyristor unit are electrically separated from each other by the MOS transistor 2, a gate loss is reduced extremely.

In connection with the above, as shown in FIGS. 2 and 3, the n+ cathode region 23 is not required to be located at the center point between the paired p+ gate regions 31, but may be shifted to the left. Enough space are allowed for photolith dimensions by this cathode shifted arrangement. That is, since a wide space is afforded between the n+ cathode region 23 and the p+ gate region 31, on the right of the n+ cathode region 23, no critical mask alignment is required and, as a result, manufacturing is further facilitated. On the other hand, even if the n+ cathode region 23 is shifted to the right between the paired gate regions 31, there can be provided similar advantages.

In fact, as shown in FIGS. 2 and 3, if the impurity concentration of the n− channel region 22 is $2 \times 10^{13}$ $cm^{-3}$, the spacing between the adjacent p+ gate regions 31 and 31 is 10 μm, and a photolith diffusion width of each of the n+ cathode region 23 and each of n+ source region 52 are 2 μm, respectively, the gate length of the polycrystalline silicon should be 2 μm. A known manufacturing method of a standard MOS transistor is used to easily manufacture this embodiment. In this embodiment, it is desirable to employ a MOS-SIT whose gate length is equal to or less than 1 μm, as a nMOS transistor, since the ON-resistance is further reduced.

Figure 4:
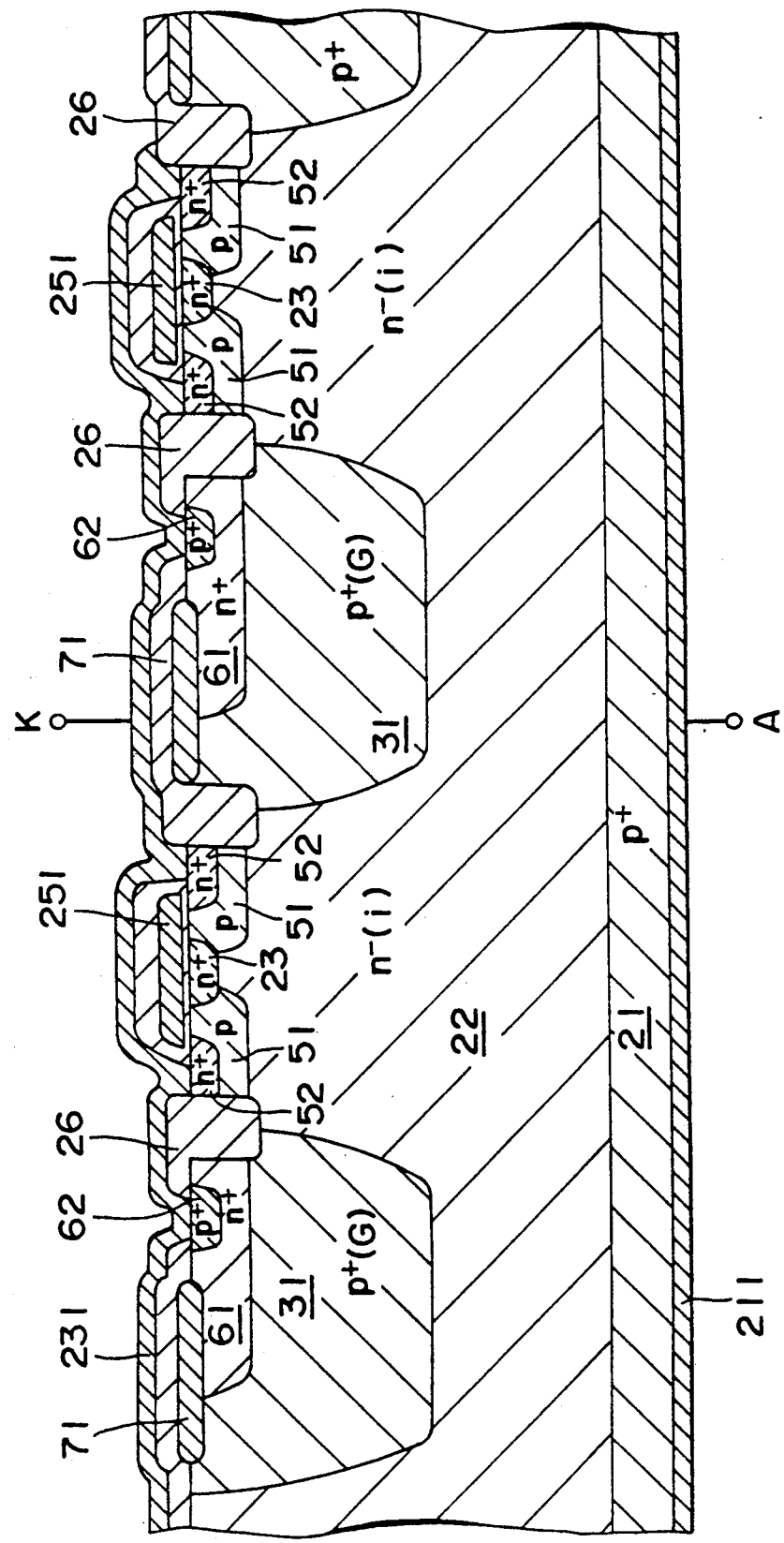
FIG. 4 is a cross-sectional view of a second embodiment of the present invention.

FIG. 4 is a cross-sectional view of a second embodiment of the invention, in which each of n+ cathode regions 23 is arranged at a center of n− channel regions, that is, at a center between adjacent p+ gate regions 31 and 31, and nMOS transistors (hereinafter referred to as "nMOS") are arranged at both sides of the n+ cathode region 23. Since two nMOSs per one channel of the main thyristor are connected, an effective gate width becomes twice, and the ON-resistance of the nMOS becomes ½, that of the first embodiment.

Moreover, a U-shaped groove is formed between an n+ source region 52 and the p+ gate region 31, and is plugged by an oxide film 26. Accordingly, it is possible to raise the breakdown voltage between the cathode and the gate. Further, since a polycrystalline silicon gate electrode 251 is formed as a common electrode for the two nMOSs, a wiring width of the polycrystalline silicon gate electrode 251 can increase approximately thrice as compared with the first embodiment. As a result, the gate resistance of the nMOS is reduced. Thus, this embodiment is adequate for high-speed operation.

Figure 5:
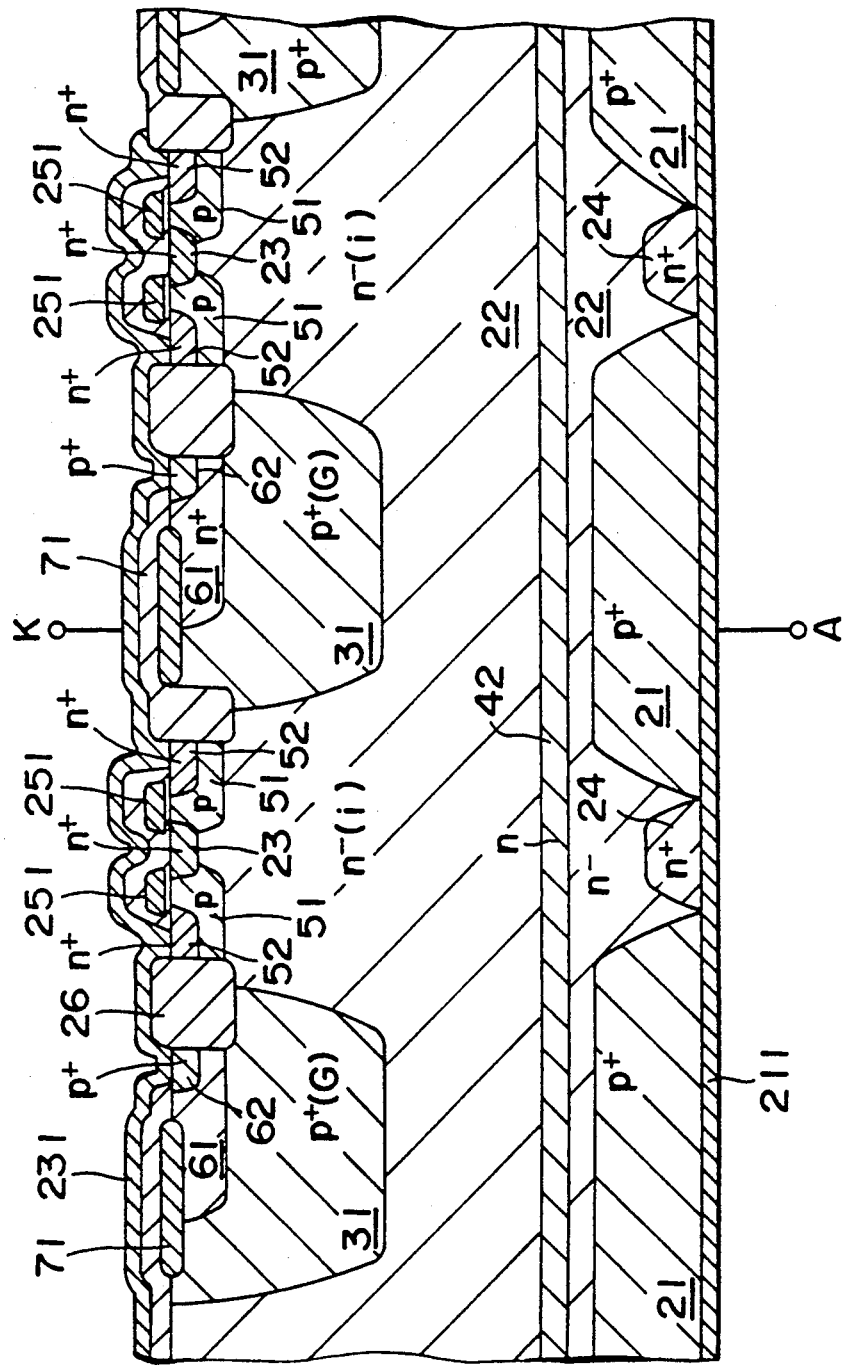
FIG. 5 is a cross-sectional view of a third embodiment of the present invention.

FIG. 5 is a cross-sectional view of a third embodiment of the invention, which is arranged such that an n-buffer layer 42 is formed adjacent to p+ anode regions 21. In this case, the impurity concentration of the n-buffer layer 42 is $1 \times 10^{15} \sim 1 \times 10^{17} cm^{-3}$, and that of an n− channel area (or i-area) 22 is of $1 \times 10^{11} \sim 1 \times 10^{12}$ $cm^{-3}$, which is extremely low, and electric field strength between the gate and the anode is uniform. Hence, it can be formed such that a depletion layer from gate areas 31 does not reach the anode areas 21. Accordingly, both maximum forward blocking voltage and switching speed can increase. Further, forward voltage drop (ON voltage) can also be reduced. If the maximum forward blocking voltage may be the same as with no $n^-$ buffer layer 42, having the thickness of the $n^-$ region 22 is sufficient. Thus, the ON voltage is naturally reduced, and the switching speed is raised.

Figure 18:
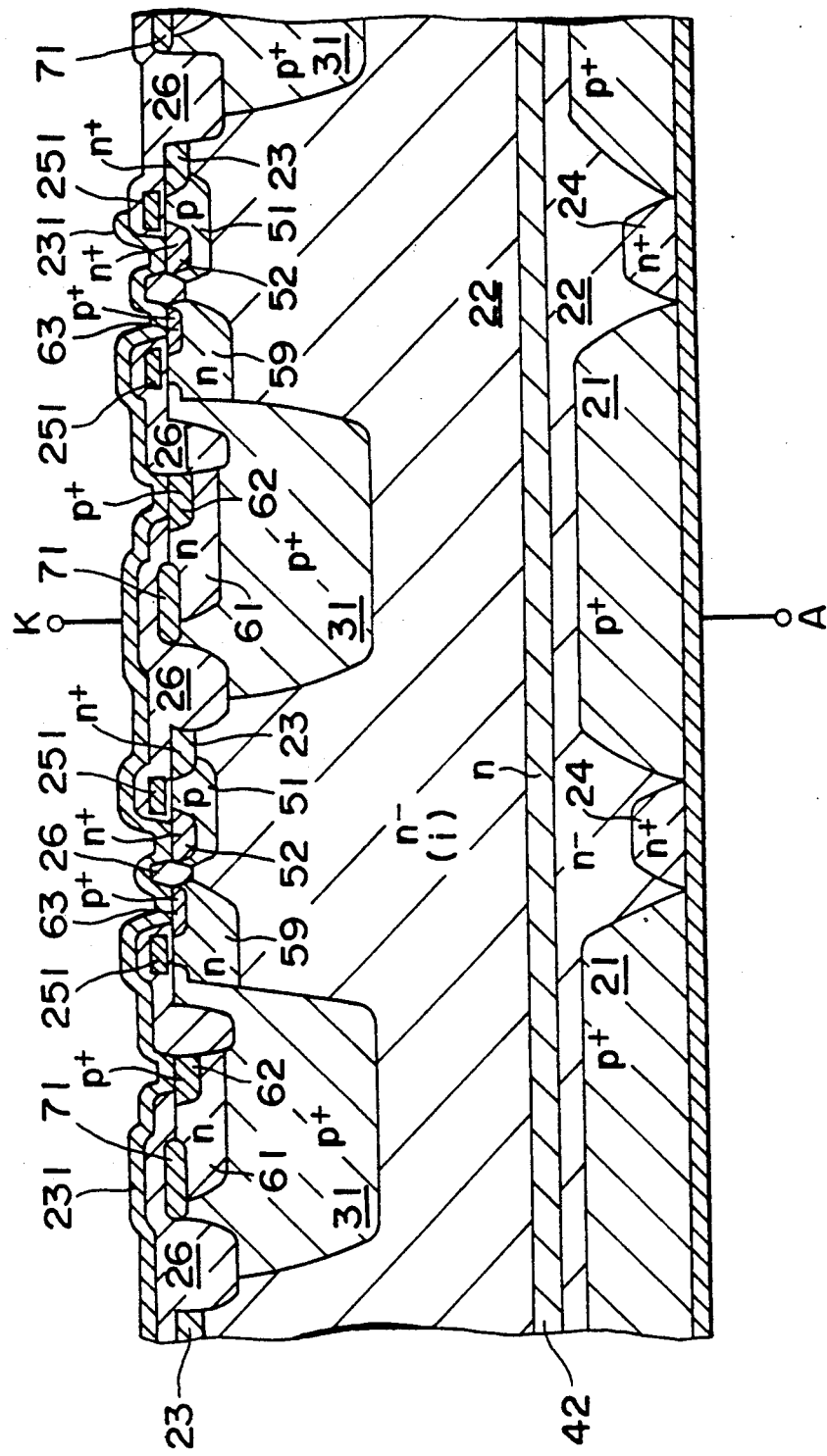
FIG. 18 is a cross-sectional view taken along a line E—E in FIG. 17.
Figure 19:
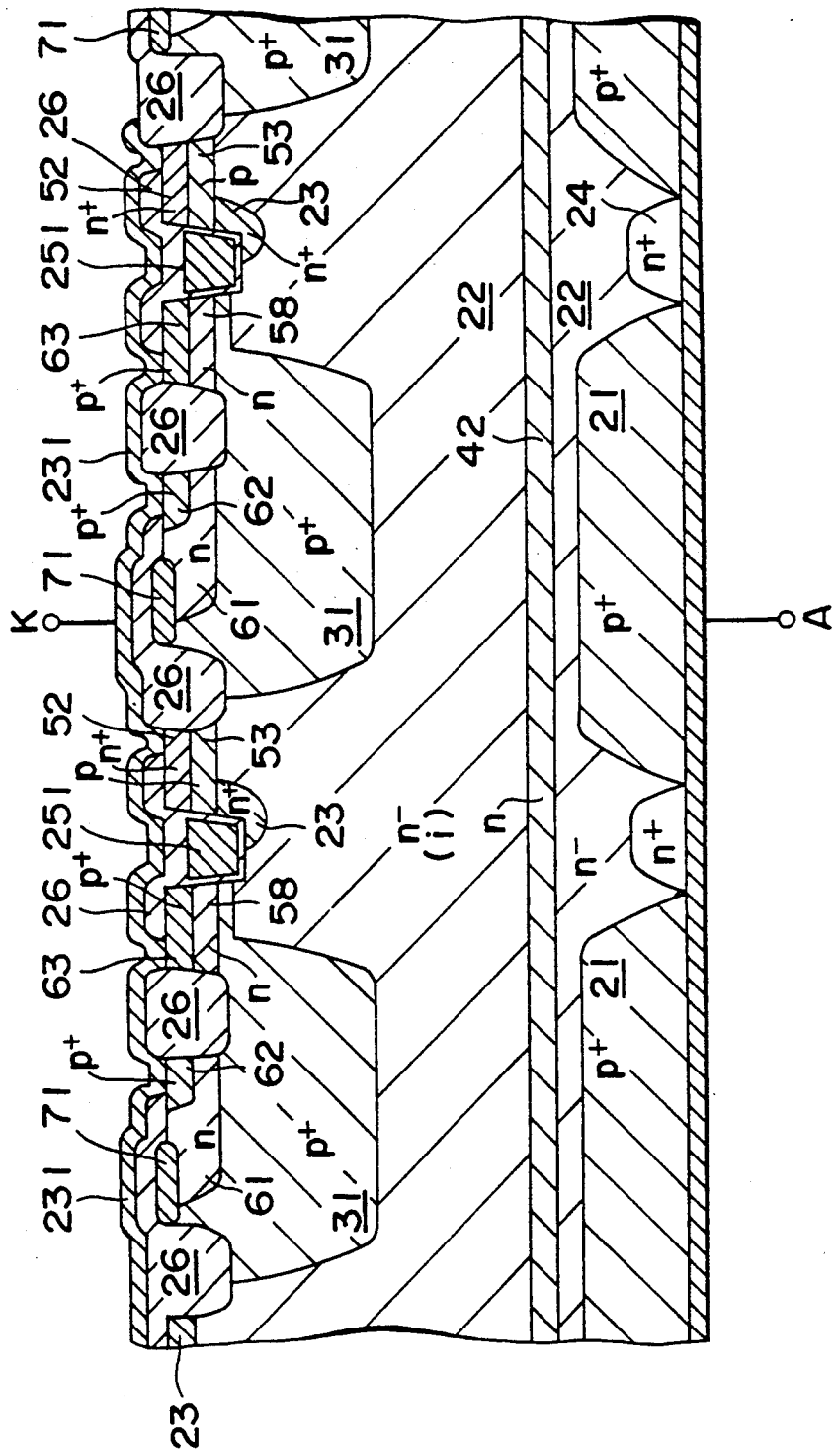
FIG. 19 is a cross-sectional view of a twelfth embodiment according to the present invention.
Figure 20:
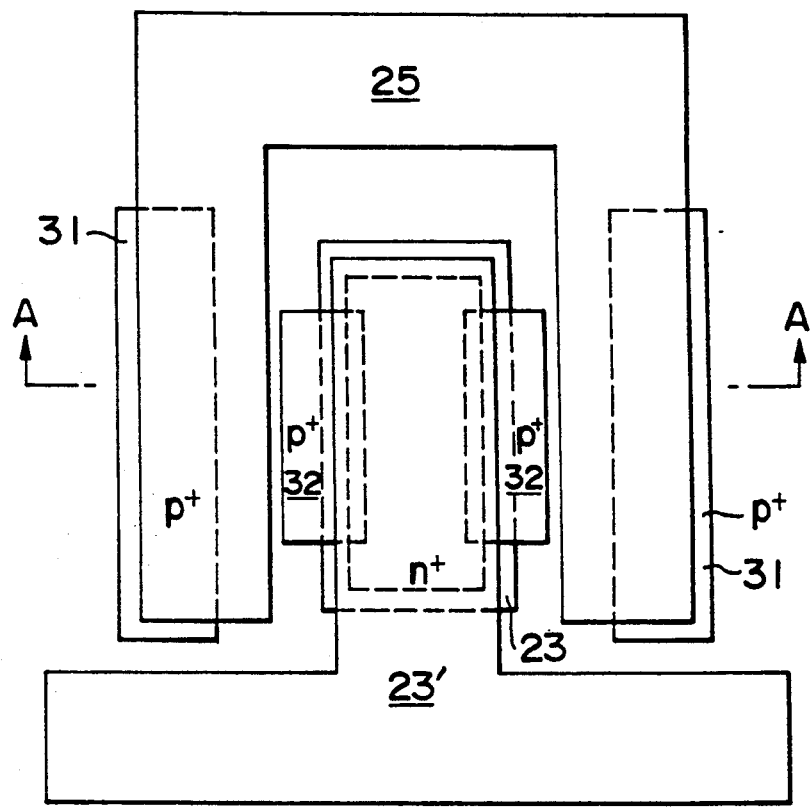
FIG. 20 is a top plan view of a conventional example.
Figure 21:
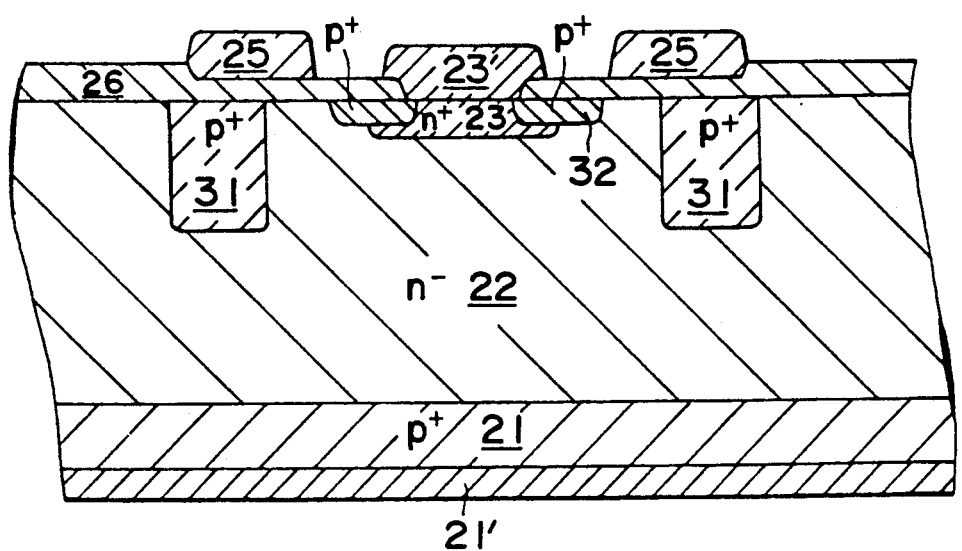
FIG. 21 is a cross-sectional view taken along a line A—A in FIG. 20.

The above-described n-buffer structure can be applied to a fourth embodiment (FIG. 6), a seventh embodiment (FIG. 11), an eighth embodiment (FIG. 12), an eleventh embodiment (FIG. 18), and a twelfth embodiment (FIG. 19). The n-buffer structure is, of course, applicable also to other embodiments except for a tenth embodiment (FIG. 15).

The embodiment illustrated in FIG. 5 is an SI anode short structure in which each of $p^+$ anode areas 21 is one of the sections formed by dividing a $p^+$ anode region, and an $n^+$ short region 24 is formed between the sections. In this case, by potential of the $p^+$ anode region 21 and potential of the $n^+$ short region 24, electrons can be swept to the $n^+$ short region 24. Accordingly, the tail current at turn-off is reduced and high-speed switching is possible. In this connection, with pitch of the divided $p^+$ anode region 21 is selected to be value equal to or less than twice the diffusion length of the electrons.

Figure 15:
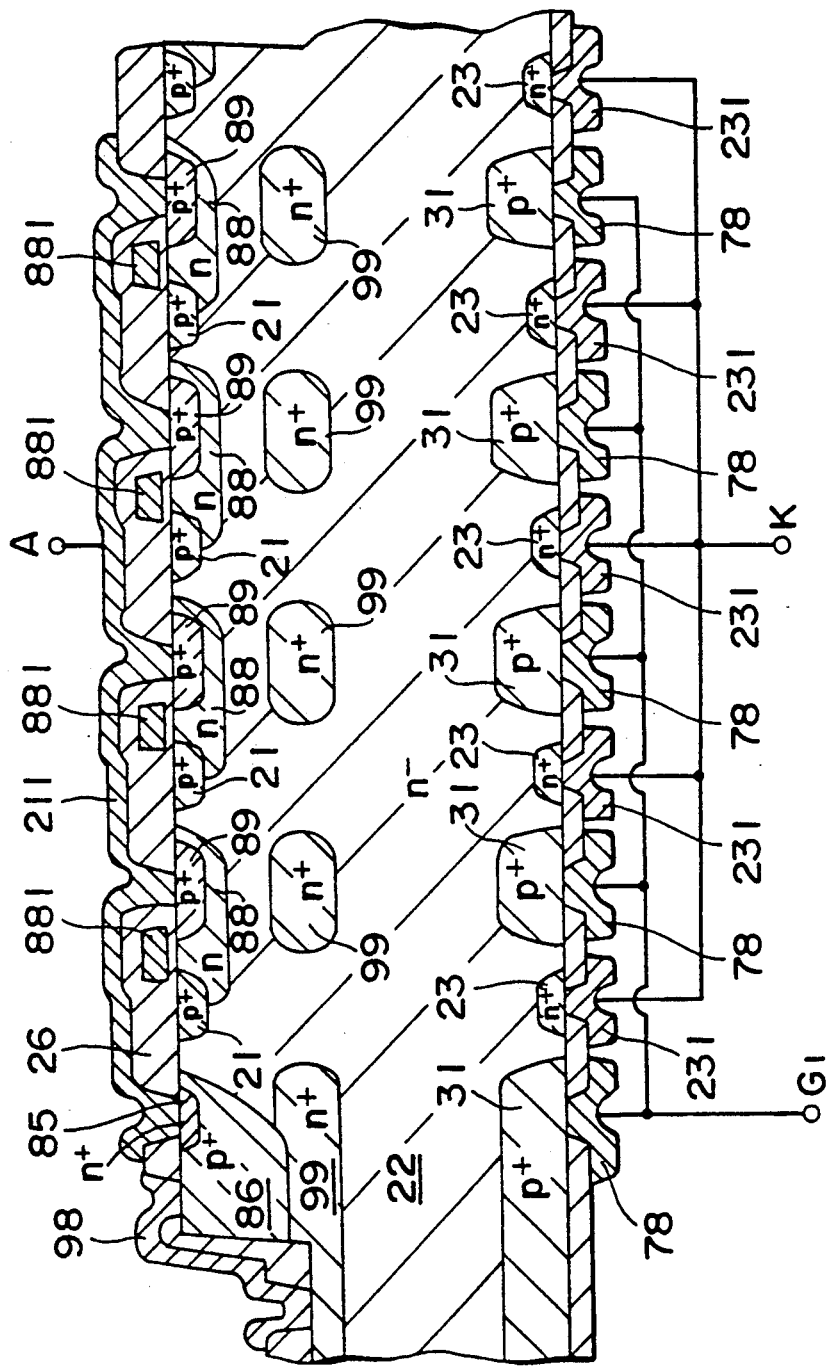
FIG. 15 is a cross-sectional view showing a specific structure into which the tenth embodiment is integrated.

The above-described SI anode short structure is applicable to a fourth embodiment (FIG. 6), a seventh embodiment (FIG. 11), an eighth embodiment (FIG. 12), an eleventh embodiment (FIG. 18), a twelfth embodiment (FIG. 19), and other embodiments except for a tenth embodiment (FIG. 15).

In the second embodiment, a polycrystalline silicon gate electrode 251 is also formed above the $n^+$ cathode region 23 (refer to FIG. 4). In the present embodiment, however, as shown in FIG. 5, the polycrystalline silicon gate electrode 251 is divided into two sections which are formed only above the nMOS channel. Accordingly, the $n^+$ drain 23 and source regions 52 are simultaneously implanted with the gate electrode 251 by a self-alignment process using the gate electrode 251 as a ion-implantation mask, similarly to a standard MOS manufacturing process.

Figure 6:
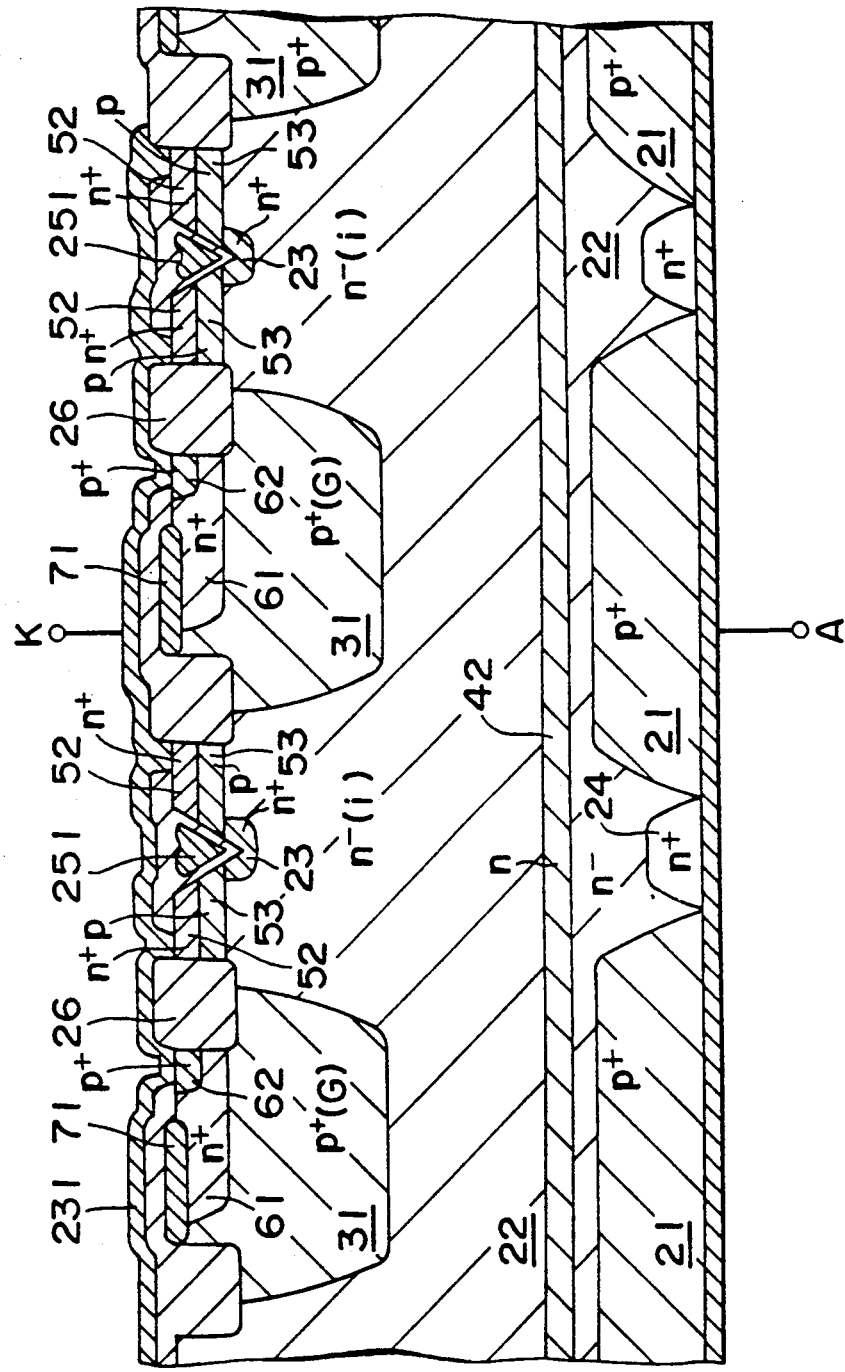
FIG. 6 is a cross-sectional view of a fourth embodiment of the present invention.

FIG. 6 is a cross-sectional view showing a fourth embodiment of the invention, a so-called VMOS structure, in which a gate oxide film 26 is formed on a side wall of a V-shaped groove (V-groove), and the polycrystalline silicon gate electrode 251 is formed within the V-groove.

This embodiment has the following advantages. A thickness and an impurity concentration of a p-base layer 53 can be selected, independently of spacing between gates of a main thyristor unit. Accordingly, design of an nMOS is facilitated, and design of a MOS composite SI thyristor is also facilitated as a whole. Particularly, since the present embodiment has a structure suitable for short-channeled nMOS structure, high speed operation at low ON-resistance is possible. The structure should not be limited to the V-groove, but also to a U-groove (UMOS).

Figure 7:
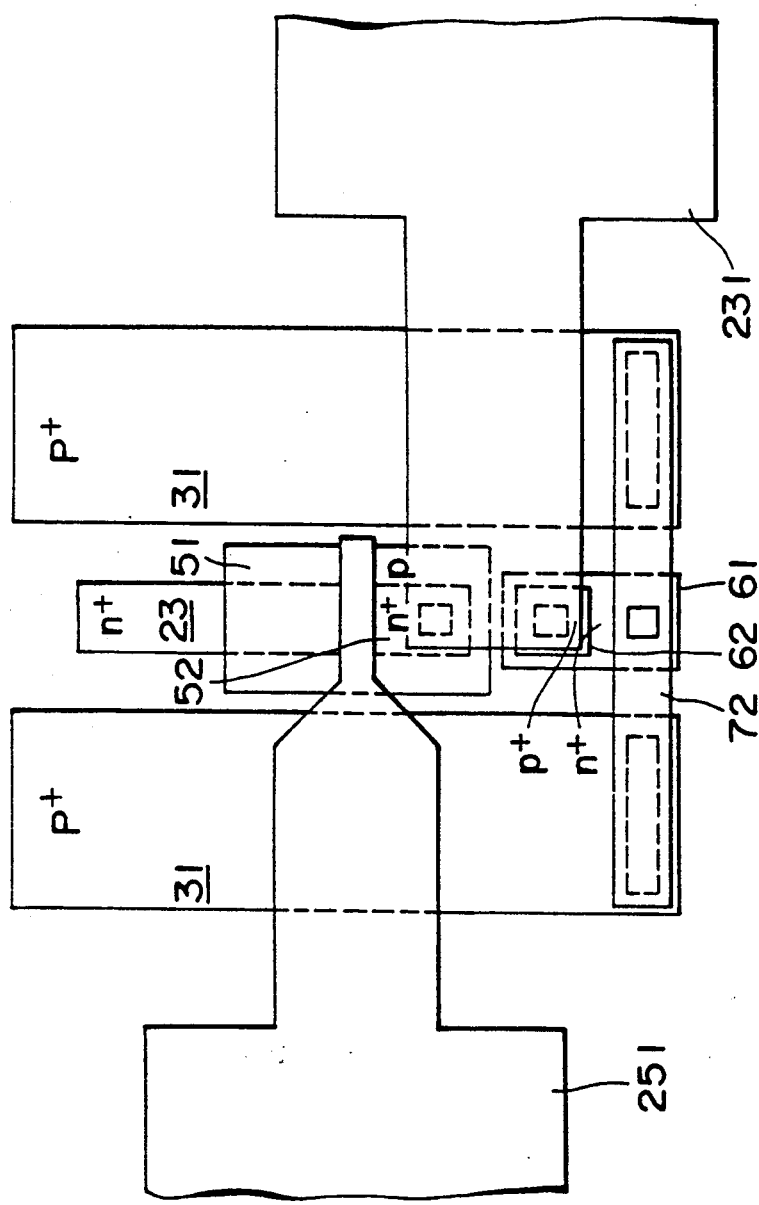
FIG. 7 is a top plan view of a fifth embodiment of the present invention.

FIG. 7 is a top plan view of a fifth embodiment of the invention, which is arranged such that an nMOS is formed in a longitudinal direction of a planar pattern (stripe) of an $n^+$ cathode region 23.

This embodiment has the advantage that a gate length of the nMOS can be selected independently of spacing between $p^+$ gate regions of the main thyristor unit, but has the disadvantage that it is impossible to increase a gate width of nMOS. Although a Zener diode having a $p^+$ region 62 and an $n^+$ region 61 is formed between adjacent $p^+$ gate regions 31 in FIG. 7, the area of the Zener diode may intrude into the $p^+$ gate region. The $n^+$ region 61 and the $p^+$ gate regions 31 are connected to each other by metal wiring 72.

Figure 8:
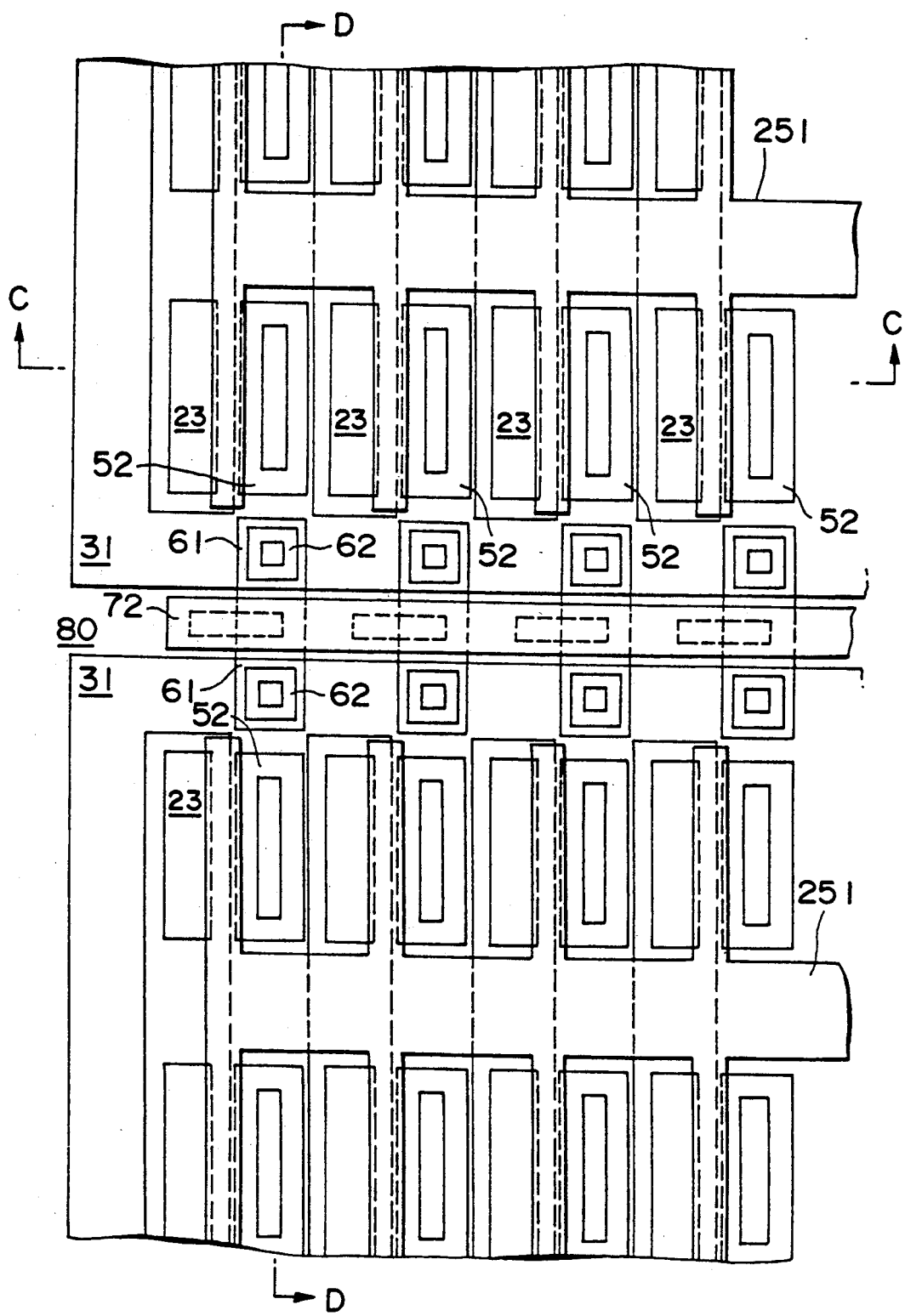
FIG. 8 is a top plan view of a sixth embodiment of the present invention.
Figure 9:
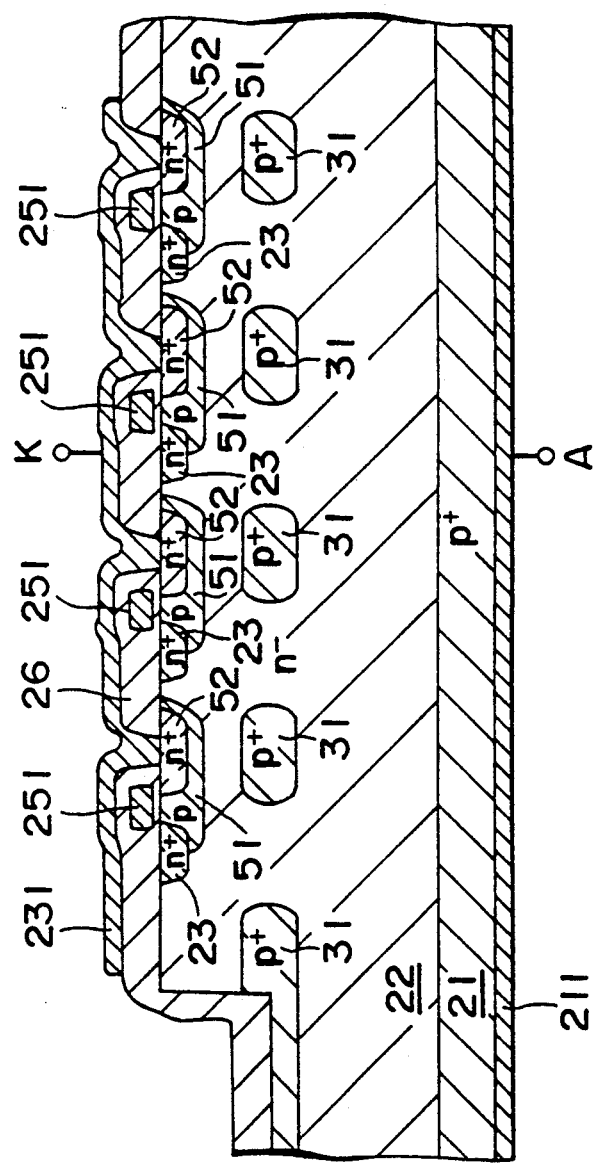
FIG. 9 is a cross-sectional view taken along a line C—C in FIG. 8.
Figure 10:
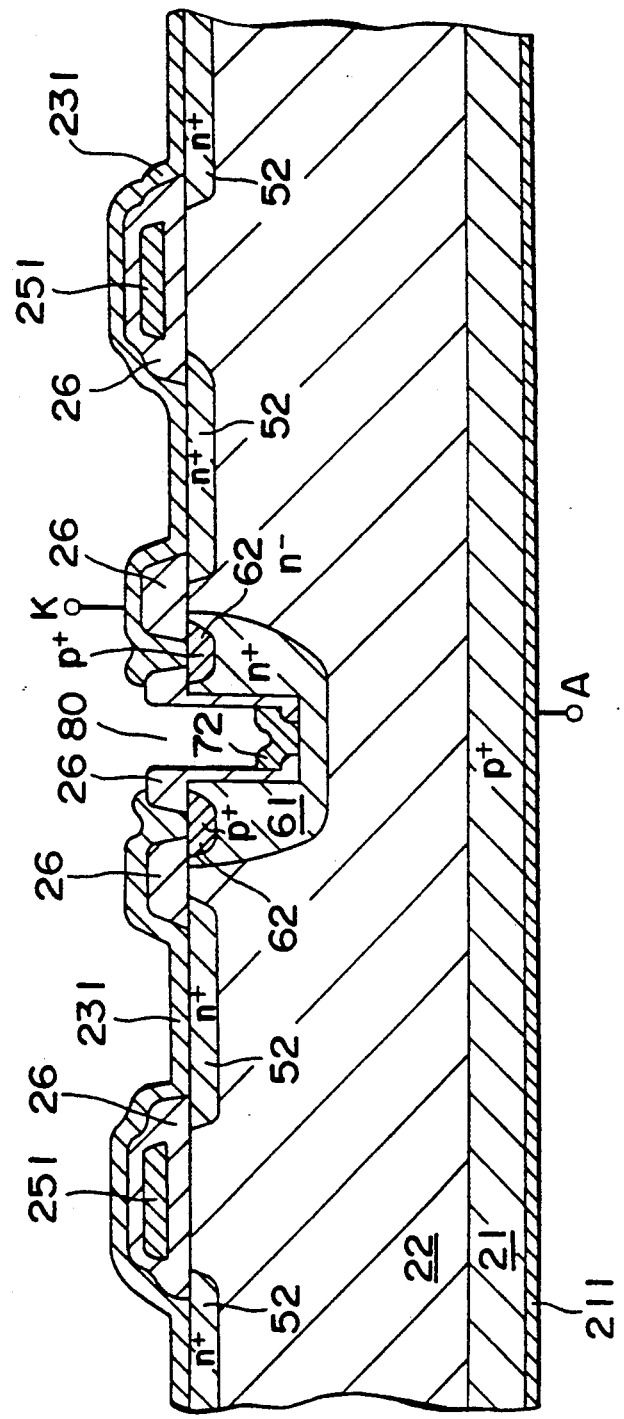
FIG. 10 is a cross-sectional view taken along a line D—D in FIG. 8.

The aforesaid first to fifth embodiments are arranged such that the main thyristor unit is a surface-gate SI thyristor unit. In the sixth embodiment, however, the main thyristor unit is a buried gate SI thyristor. FIG. 8 is a top plan view of the sixth embodiment, and FIG. 9 is a cross-sectional view taken along a line C—C in FIG. 8, while FIG. 10 is a cross-sectional view taken along a line D—D in FIG. 8.

An nMOS consisting of each of $n^+$ source regions 52 formed within a corresponding p-well 51, an $n^+$ drain region 23 serving also as an $n^+$ cathode region of an SI thyristor unit, and a gate electrode 251 can use almost all the surface on the cathode side. Accordingly, an area occupying rate of nMOS is high, a degree of freedom of nMOS design is large, and an ON-resistance of the nMOS can be reduced. Further, since a manufacturing process of the nMOS may entirely be the same as that of standard MOSs, manufacturing is extremely easy. A plurality of $p^+$ gate regions 31 and $n^+$ regions 61 forming a Zener diode are connected to each other by a metal wiring layer 72 at a bottom of a U-groove 80.

Figure 11:
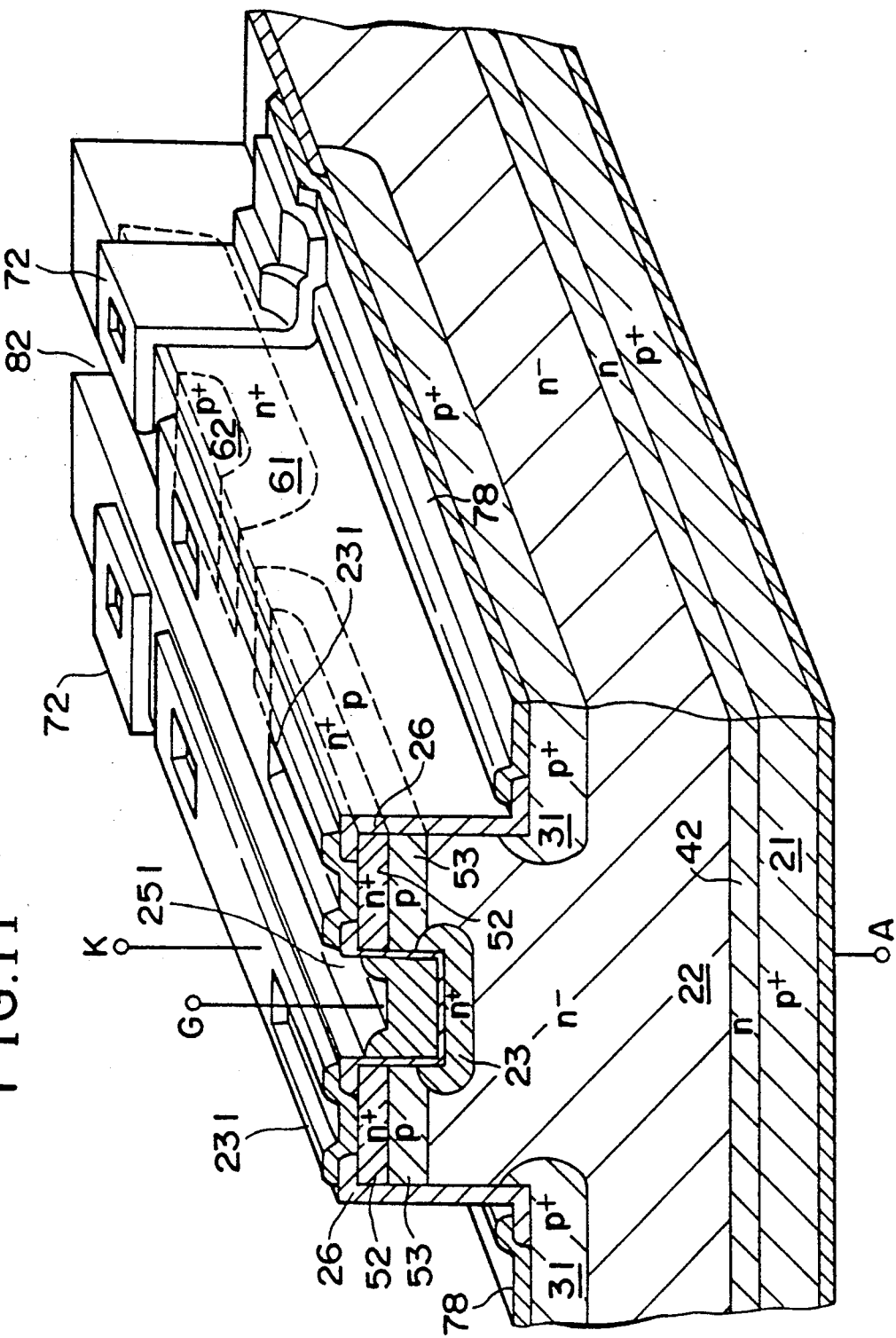
FIG. 11 is a partially cut-away perspective view of a seventh embodiment according to the present invention.
Figure 12:
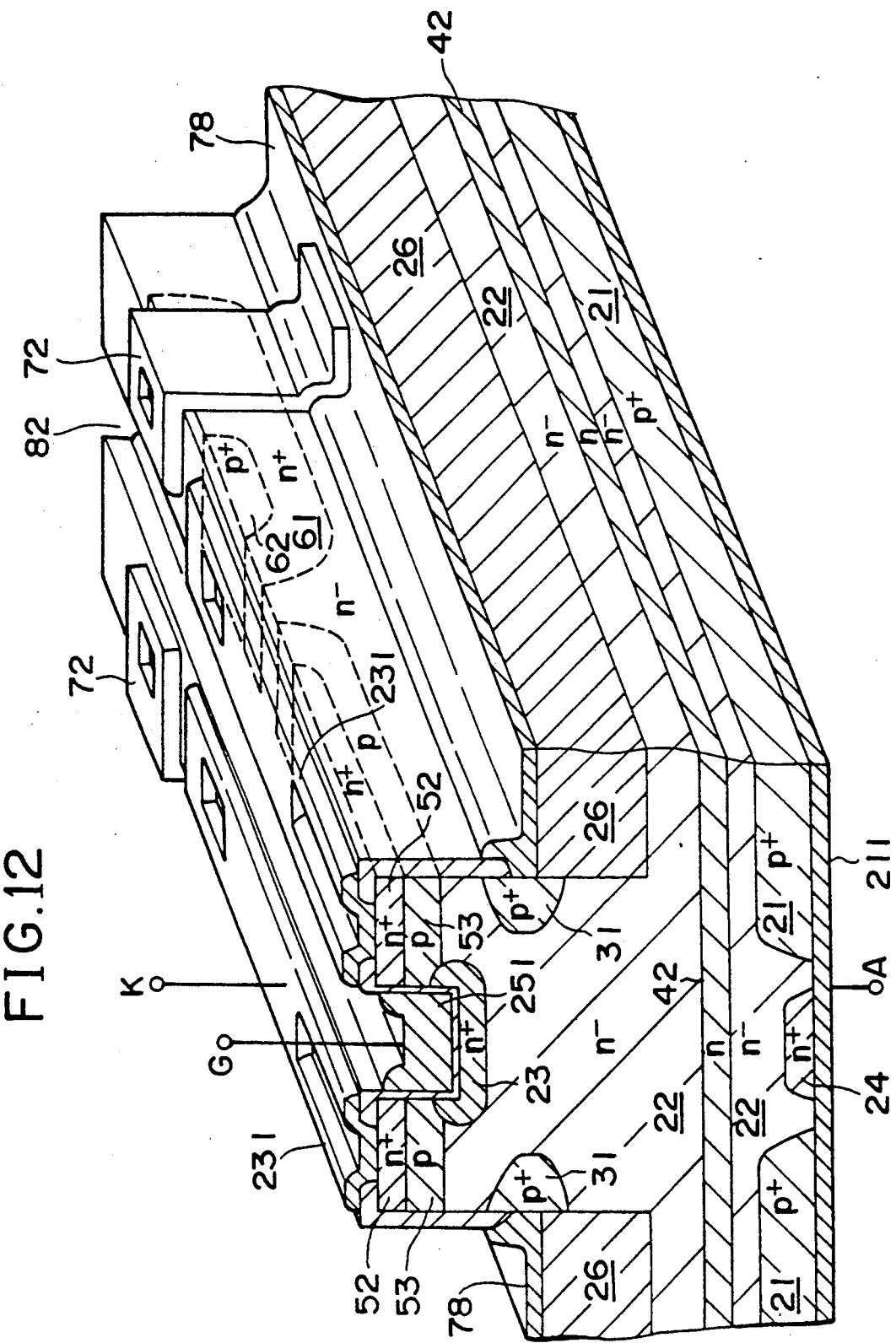
FIG. 12 is a partially cut-away perspective view of an eighth embodiment according to the present invention.
Figure 13:
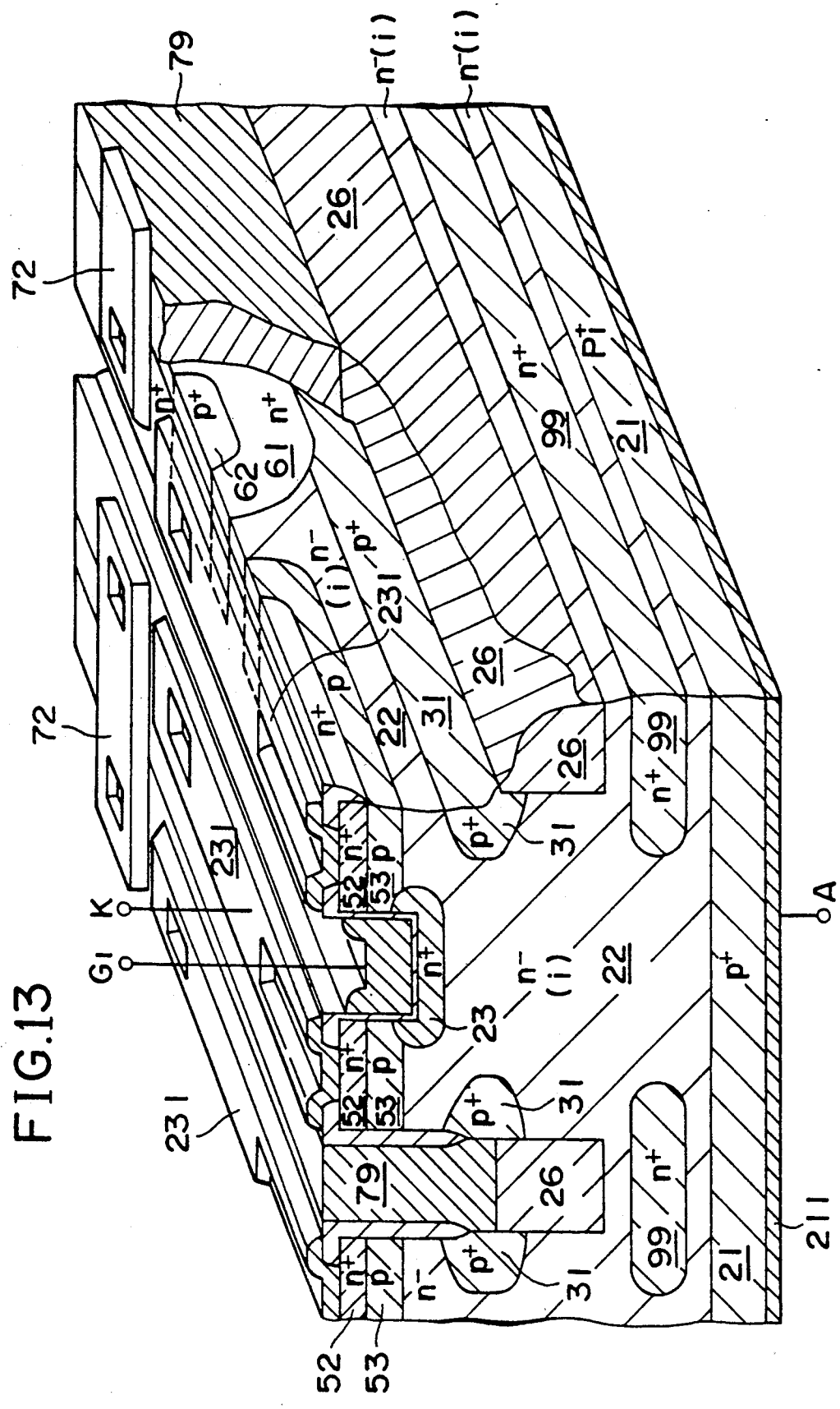
FIG. 13 is a partially cut-away perspective view of a ninth embodiment according to the present invention.

FIGS. 11 through 13 are partially cut-away perspective views of seventh to ninth embodiments of the invention, respectively, each of which is arranged such that a main thyristor unit is a recessed-gate SI thyristor. In the seventh embodiment (FIG. 11), a pair of $p^+$ gate regions 31 are formed in the entire bottom of a U-groove. In the eighth embodiment (FIG. 12) and the ninth embodiment (FIG. 13), however, the $p^+$ gate regions 31 are formed respectively only on side walls of the U-grooves, and thick oxide films 26 are formed respectively at bottoms of gate electrodes 78 and 79. By this structure, capacitance between the gate and the anode is extremely low, and high-speed operation is possible.

In the seventh and eighth embodiments, an nMOS is a UMOS in which a gate oxide film is formed on a side wall of a second U-groove 82 at a center of a convexed channel 22. The nMOS comprises $n^+$ source regions 52, p-base 53, $n^+$ drain regions 23 serving also as cathode regions of an SI thyristor unit, and a gate electrode 251. However, the nMOS may be a VMOS as in the fourth embodiment (FIG. 6). Similarly to the fourth embodiment, design parameters of the nMOS in the seventh and eighth embodiments can be selected independently of main thyristor dimensions, and the degree of freedom of design is large. Accordingly, it is easy to reduce a channel length and an ON-resistance of the nMOS, and high-speed operation is easily obtained.

A Zener diode is formed by a $p^+$ region 62 and an $n^+$ region 61. In the seventh and eighth embodiments, however, the $n^+$ region 62 and the gate electrodes 78 of the SI thyristor unit are connected to each other at a location within the U-groove by a polycrystalline silicon wiring layer 72 extending up to the side walls of the U-groove. In the ninth embodiment, since the gate electrode 79 fills up the U-groove by selective CVD of W (tungsten), the $n^+$ region 61 and the gate electrode 79 are wired on the same plane, and there is no fear of wire breaking. By a structure of the ninth embodiment in which the U-groove is filled up by the gate electrode, a gate resistance of the SI thyristor unit is extremely low, and super high frequency operation is possible. The ninth embodiment has a double-gate SI thyristor unit in which p+ region 31 is a first gate of recessed structure, and the n+ region 99 is a second gate of a buried gate structure. There is no turn-off tail current, and high-speed operation is possible with a low ON-resistance.

Figure 14:
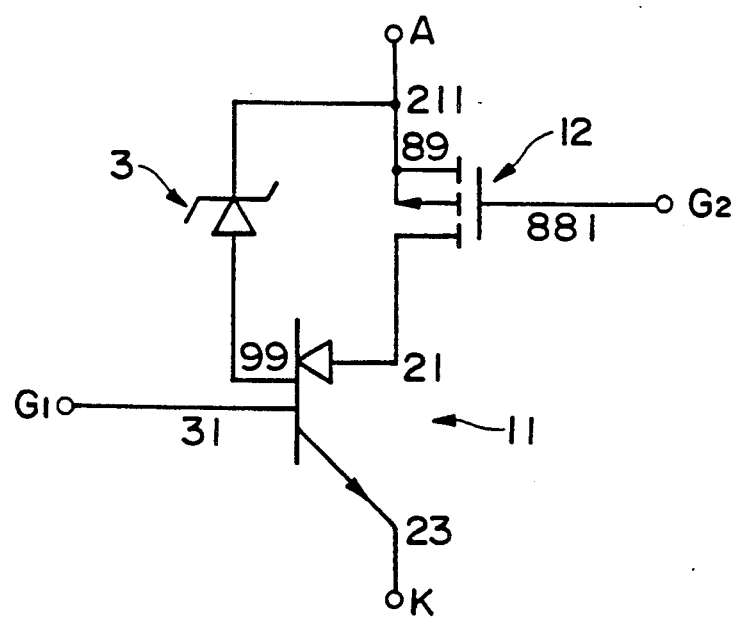
FIG. 14 is a circuit diagram of a tenth embodiment according to the present invention.

FIG. 14 is a circuit diagram of a tenth embodiment, while FIG. 15 is a cross-sectional view of a specific structure into which the tenth embodiment is integrated. The tenth embodiment is arranged such that a Zener diode 3 is connected to a location between a second gate 99 and an anode electrode 211 of a double gate SI thyristor unit 11; a p+ anode region 21 serves as a p+ drain region and a p+ region 89 is a source area so that a MOSFET 12 is formed within an n-well 88. The source region 89 and the anode electrode 211 are connected to each other. In FIG. 15, although the first gate is shown as a surface gate structure, while a second gate is shown as a buried gate structure, both the first and second gates may be a buried type, and the first gate may be a recessed gate. The first and second gates may be a combination other than those mentioned above. The combination should be selected in accordance with objects.

An n+ region 85 and a p+ region 86 cooperate with each other to form the Zener diode 3. The second gate region 99 and the p+ region 86 are connected to each other by wiring 98 consisting of polycrystalline silicon. Of course, the Zener diode 3 and an nMOS 2 may be connected between the first gate region 31 and the n+ cathode region 23, as illustrated in FIG. 1.

Figure 16:
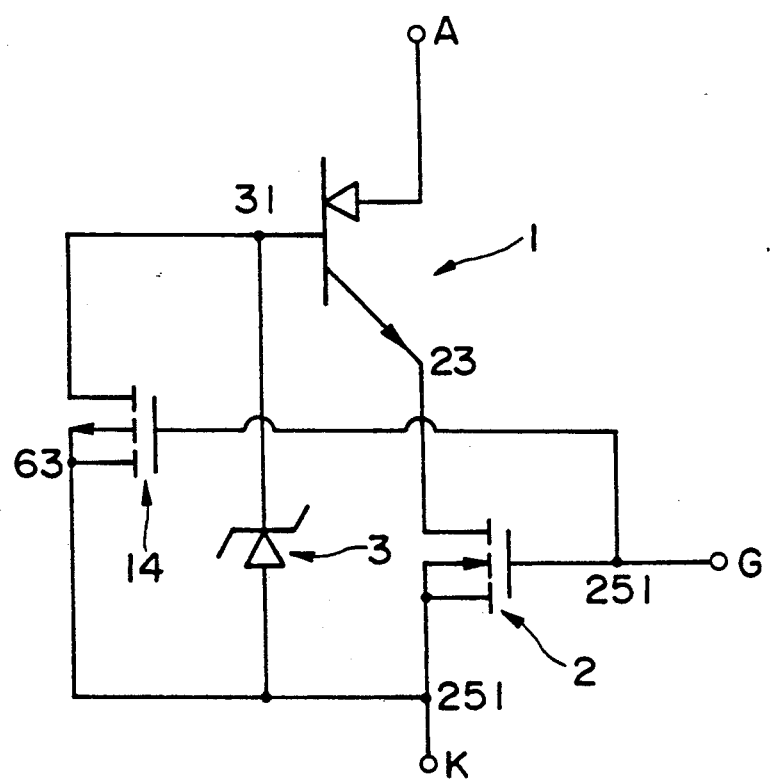
FIG. 16 is a circuit diagram of an eleventh embodiment according to the present invention.
Figure 17:
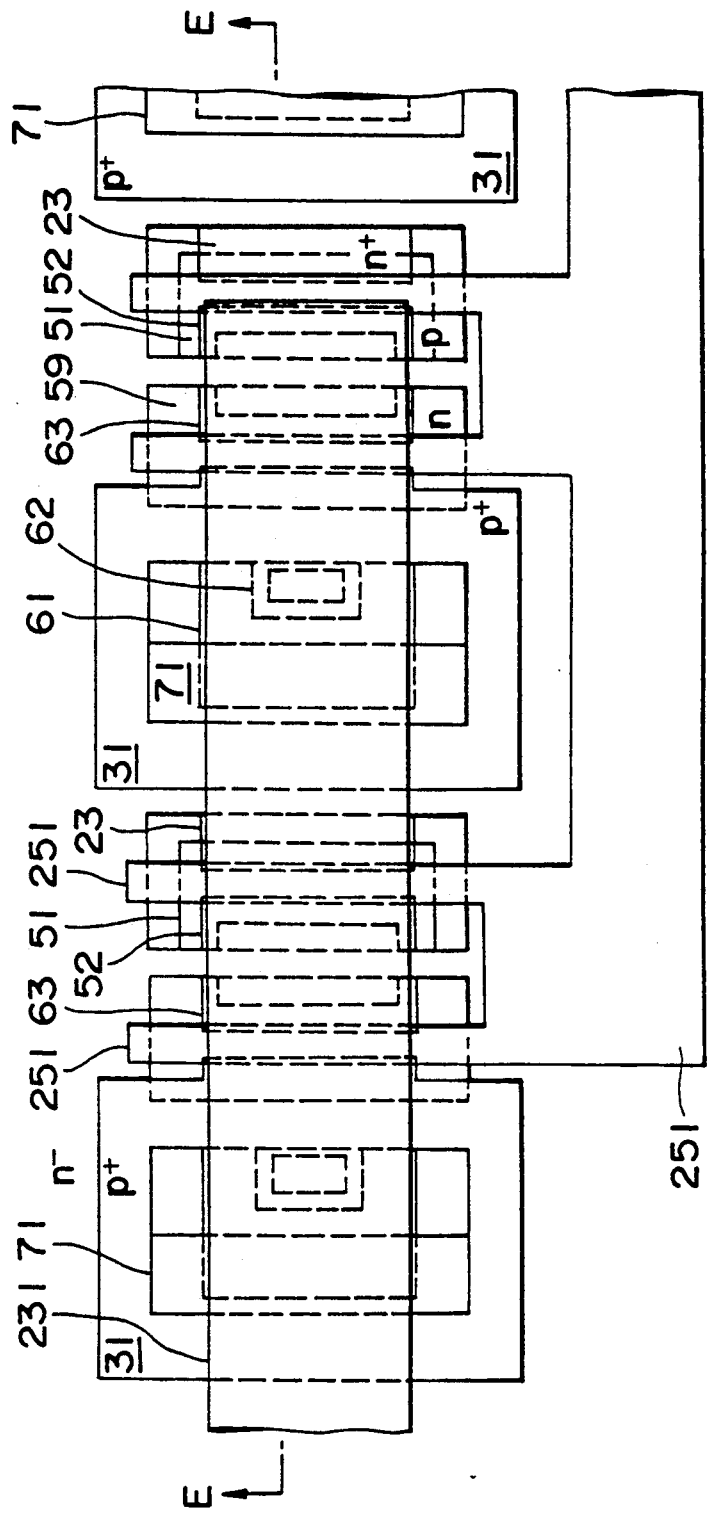
FIG. 17 is a cross-sectional view showing a specific structure into which the eleventh embodiment is integrated.

FIG. 16 is a circuit diagram of an eleventh embodiment of the invention, and FIG. 17 is a cross-sectional view of a specific structure into which the eleventh embodiment is integrated, while FIG. 18 is a cross-sectional view taken along a line E—E in FIG. 17. The eleventh embodiment is arranged such that a depletion made (normally-ON type) p-channel MOS transistor (hereinafter referred to as "pMOS") 14 is connected in parallel to a Zener diode 3 which is connected between a p+ gate region 31 and a cathode electrode 231, and a gate electrode of the pMOS 14 is connected to a gate electrode of the nMOS.

Both the pMOS 14 and the nMOS 2 are planar structure. The pMOS, composed of a p+ source region 63 and p+ drain region 31 is formed within a n-well 59. Similarly to the aforesaid third embodiment, a n+ region 23 serves both as a cathode region of the SI thyristor unit 1 and as the drain region of the nMOS. The nMOS 2 is formed within a p-well 51, and an n+ region 52 is a source region of the nMOS 2.

In this embodiment, when positive voltage is applied to a gate electrode 251, the nMOS 2 is turned on. If voltage $V_{nMOS}$ between the drain and the cathode becomes smaller than breakdown voltage $V_{ZD}$ of the Zener diode 3, a forward bias is applied between the gate region 31 and the cathode region 23 of the SI thyristor unit 1. Accordingly, the SI thyristor is turned on. At this time, the pMOS 14 is under off state.

Next, when the voltage of the gate electrode 251 is brought to zero or to off-bias voltage for the nMOS 2, the nMOS 2 is turned off, and the pMOS 14 is turned on, so that main current flowing through the channel of the SI thyristor unit 1 is withdrawn from the p+ gate area 31 of the SI thyristor unit 1 through the pMOS 14 and flows to the cathode electrode 231. Accordingly, the SI thyristor unit 1 is turned off. At this turning off, turning-off current flows also to the Zener diode 3, and a reverse-bias is applied between the gate and the cathode of the SI thyristor unit 1 by the following difference between the breakdown voltage ($V_{ZD}$) of the Zener diode and the voltage ($V_{nMOS}$) between the drain and the source of the nMOS:

$$V_{GK} = V_{nMOS} - V_{ZD}$$

Accordingly, the ON-voltage of the pMOS is selected to be a value substantially equal to or slightly smaller than $V_{ZD}$. This embodiment is effective in a case where the main thyristor unit has a characteristic between normally-off and normally-on.

FIG. 19 is a cross-sectional view of a twelfth embodiment of the invention. The twelfth embodiment has a circuit arrangement similar to that of the eleventh embodiment, but is different in that the twelfth embodiment has a so-called UMOS, or vertical structure in which a polycrystalline silicon gate 251 is formed in a U-groove. It is easy by the present embodiment to decrease a channel length of the MOS transistor so that high-speed operation is possible with low ON-resistance. As shown in FIG. 19, an n+ source region 52 of the nMOS 2 is formed above a p-base 53, and a p+ source region 63 of the pMOS 14 is formed above the n-base 58.

In the above-described eleventh and twelfth embodiments, the structure in which the pMOS 14 and the nMOS 2 are reversed and connected to the SI thyristor unit 1 is also effective.

What is claimed is:

1. A MOS composite static induction thyristor comprising:
    a SI thyristor unit having a cathode region of a first conductivity type having a high impurity concentration, an anode region and a gate region of a second conductivity type having a high impurity concentration, and a channel region of said first conductivity type having a low impurity concentration;
    a MOS transistor having a drain region that is the same region as said cathode region of said SI thyristor, a well of said second conductivity type formed adjacent to said channel region, a source region of said first conductivity type having a high impurity concentration formed within said well, a gate insulating firm formed on a surface of said well region between said source region and drain regions, and a MOS gate electrode formed above said gate insulating film; and
    a voltage regulation element having a first semiconductor region of said second conductivity type having a high impurity concentration, and a second semiconductor region of said first conductivity type having a high impurity concentration, wherein said first semiconductor region and said source region are connected by a first wiring layer, and said second semiconductor region and said gate region are connected by a second wiring layer, said second wiring layer comprising the sole connection to said gate region;
    wherein said SI thyristor unit, said MOS transistor and said voltage regulation element are merged onto a single monolithic chip; and
    wherein control voltage is applied to said MOS gate electrode, so that principal current flowing between said anode and cathode regions is controlled.

2. A MOS composite static induction thyristor according to claim 1, wherein said SI thyristor unit has at least two adjacent gate regions and said cathode region is shifted toward one side between the adjacent gate regions.

3. A MOS composite static induction thyristor according to claim 1, wherein said SI thyristor unit has at least two adjacent gate regions, said cathode region is arranged at a center between the adjacent gate regions, and said MOS transistor is arranged on both sides of said cathode region, respectively.

4. A MOS composite static induction thyristor according to claim 3, including a groove formed between said source and cathode regions and an oxide film deposited within said groove.

5. A MOS composite static induction thyristor comprising:
an SI thyristor unit having a cathode region of a first conductivity type having a high impurity concentration, an anode region and a gate region of a second conductivity type having a high impurity concentration, and a channel region of said first conductivity type having a low impurity concentration;
a MOS transistor having a drain region that is the same region as said cathode region of said SI thyristor a base of said second conductivity type formed adjacent to said channel region, a source region of said first conductivity type having a high impurity concentration formed above said base, a gate insulating film formed on a surface of said base between said source and drain regions, and a MOS gate electrode formed adjacent to said gate insulating film; and
a voltage regulation element having a first semiconductor region of said second conductivity type having a high impurity concentration, and a second semiconductor region of said first conductivity type having a high impurity concentration, wherein said first semiconductor region and said source region are connected by a first wiring layer, and said second semiconductor region and said gate region are connected by a second wiring layer, said second wiring layer comprising the sole connection to said gate region;
wherein said SI thyristor unit, said MOS transistor and said voltage regulation element are merged onto a single monolithic chip.

6. A MOS composite static induction thyristor according to claim 5, wherein said SI thyristor unit has at least two adjacent gate regions, said cathode region is arranged at a center between the adjacent gate regions, and said MOS transistors are arranged on both sides of said cathode region, respectively.

7. A MOS composite static induction thyristor according to claim 6, including a groove formed between said source and cathode regions, and an oxide film deposited within said groove.

8. A MOS composite static induction thyristor comprising:
an SI thyristor unit having a cathode region of a first conductivity type having a high impurity concentration, an anode region and a gate region of a second conductivity type having a high impurity concentration, and a channel region of said first conductivity type having a low impurity concentration;
a MOS transistor having a drain region that is the same region as said cathode region of said SI thyristor, a well of said second conductivity type formed adjacent to said channel region, a source region of said first conductivity type having a high impurity concentration formed within said well, a gate insulating film formed on a surface of said well between said source and drain regions, and a MOS gate electrode formed above said gate insulating film said MOS transistor begin formed longitudinally along a long side of said cathode region; and
a voltage regulation element having a first semiconductor region of second conductivity type having high impurity concentration, and a second semiconductor region of first conductivity type having high impurity concentration;
wherein said SI thyristor unit, said MOS transistor and said voltage regulation element are merged onto a single monolithic chip,
wherein said first semiconductor region and said source region are connected to each other through a first wiring layer of high conductivity, and said second semiconductor region and said gate region are connected to each other through a second wiring layer of high conductivity, said second wiring layer comprising the sole connection to said gate region, and
wherein control voltage is applied to said MOS gate electrode, so that the principal current flowing between said anode and cathode regions is controlled.

9. A MOS composite static induction thyristor comprising:
an SI thyristor unit having a cathode region of a first conductivity type having a high impurity concentration, an anode region and a gate region of a second conductivity type having a high impurity concentration, and a channel region of said first conductivity type having a low impurity concentration;
a MOS transistor having a drain region that is the same region as said cathode region of said SI thyristor, a well of said second conductivity type formed adjacent to said channel region, a source region of said first conductivity type having a high impurity concentration formed within said well, a gate insulating film formed on a surface of said well between said source and drain regions, and a MOS gate electrode formed above said gate insulating film; and
a voltage regulation element having a first semiconductor region of said second conductivity type having a high impurity concentration, and a second semiconductor region of said first conductivity type having a high impurity concentration;
wherein said SI thyristor unit, said MOS transistor and said voltage regulation element are merged onto a single monolithic chip,
wherein said first semiconductor region and said source region are connected to each other through a first wiring layer of high conductivity, and said second semiconductor region and said gate region are connected to each other through a second wiring layer of high conductivity, said second wiring layer comprising the sole connection to said gate region,
wherein said gate region is buried within said channel region, and
wherein control voltage is applied to said MOS gate electrode, so that principal current flowing between said anode and cathode regions is controlled.

10. A MOS composite static induction thyristor comprising:
   an SI thyristor unit having a cathode region of a first conductivity type having a high impurity concentration, an anode region and a pair of gate regions of a second conductivity type having a high impurity concentration, and a channel region of said first conductivity type having a low impurity concentration;
   a MOS transistor having a drain region that is the same region as said cathode region of said SI thyristor, a base of said second conductivity type formed adjacent to said channel region, a source region of said first conductivity type having a high impurity concentration formed above said base, a gate insulating film formed on a surface of said base between said source and drain regions, and a MOS gate electrode formed adjacent to said gate insulating film; and
   a voltage regulation element having a first semiconductor region of second conductivity type having high impurity concentration, and a second semiconductor region of first conductivity type having high impurity concentration;
   wherein said SI thyristor unit, said MOS transistor and said voltage regulation element are merged onto a single monolithic chip,
   wherein said first semiconductor region and said source region are connected to each other through a first wiring layer of high conductivity, and said second semiconductor region and said gate regions are connected to each other through a second wiring layer of high conductivity, said second wiring layer comprising the sole connection to said gate region,
   wherein said MOS composite static induction thyristor further comprises a pair of grooves, said gate regions are formed on bottom surfaces of said grooves, and said cathode region is formed substantially at a center of an upper portion of said channel region which is sandwiched in between said grooves, and
   wherein control voltage is applied to said MOS gate electrode, so that principal current flowing between said anode and cathode regions is controlled.

11. A MOS composite static induction thyristor comprising;
   an SI thyristor unit having a cathode region of a first conductivity type having a high impurity concentration, an anode region and a pair of gate regions of a second conductivity type having a high impurity concentration, and a channel region of said first conductivity type having a low impurity concentration;
   a MOS transistor having a drain region that is the same region as said cathode region of said SI thyristor, a base of said second conductivity type formed adjacent to said channel region, a source region of said first conductivity type having high impurity concentration formed above said base, a gate insulating film formed on a surface of said base between said source and drain region, and a MOS gate electrode formed adjacent to said gate insulating film; and
   a voltage regulation element having a first semiconductor region of second conductivity type having high impurity concentration, and a second semiconductor region of first conductivity type having high impurity concentration;
   wherein said SI thyristor unit, said MOS transistor and said voltage regulation element are merged onto a single monolithic chip,
   wherein said first semiconductor region and sid source region are connected to each other through a first wiring layer of high conductivity, and said second semiconductor region and said gate regions are connected to each other through a second wiring layer of high conductivity, said second wiring layer comprising the sole connection to said gate region,
   wherein said MOS composite static induction thyristor further comprises a pair of grooves, said gate regions are formed on side walls of said grooves, and said cathode region is formed substantially at a center of an upper portion of said channel region which is sandwiched in between said grooves, and
   wherein control voltage is applied to said MOS gate electrode, so that principal current flowing between said anode and said cathode regions is controlled.

12. A MOS composite static induction thyristor according to claim 11, wherein said grooves are plugged by said gate electrode.

13. A MOS composite static induction thyristor according to claim 10, wherein said SI thyristor unit has at least two adjacent gate regions, said cathode region is arranged at a center between the adjacent gate regions, and said MOS transistor is formed on both sides of said cathode region.

14. A MOS composite static induction thyristor according to claim 11, wherein said SI thyristor unit has at least two adjacent gate regions, said cathode region is arranged at a center between the adjacent gate regions, and said MOS transistor is formed on both sides of said cathode region.

15. A MOS composite static induction thyristor according to claims 12, wherein said SI thyristor unit has at least two adjacent gate regions, said cathode region is arranged at a center between the adjacent gate regions, and said MOS transistor is formed on both sides of said cathode region.

16. A MOS composite static induction thyristor comprising:
   a double gate SI thyristor unit having a cathode region and a second gate region of a first conductivity type having a high impurity concentration, an anode region and a first gate region of a second conductivity type having a high impurity concentration, and a channel region having a low impurity concentration;
   a MOS transistor having a drain region that is the same region as said anode region, a well of said first conductivity type formed adjacent to said channel region, a source region of said second conductivity type having high impurity concentration formed within said well, a gate insulating film formed on a surface of said well between said source and drain regions, and a MOS gate electrode formed above said gate insulating film; and
   a voltage regulation element having a first semiconductor region of first conductivity type having high impurity concentration, and a second semiconductor region of second conductivity type having high impurity concentration;

wherein said SI thyristor unit, said MOS transistor and said voltage regulation element are merged onto a single monolithic chip, wherein said first semiconductor region and said source region are connected to each other through a first wiring layer of high conductivity, and said second semiconductor region and said second gate region are connected to each other through a second wiring layer of high conductivity, said second wiring layer comprising the sole connection to said gate region, and wherein control voltage is applied to at least one of said MOS gate electrode or said gate region, so that principal current flowing between said anode and cathode regions is controlled.

17. A MOS composite static induction thyristor comprising:

an SI thyristor unit having a cathode region of a first conductivity type having a high impurity concentration, an anode region and a gate region of a second conductivity type having a high impurity concentration, and a channel region of said first conductivity type having low impurity concentration;

a first MOS transistor having a first drain region that is the same region as said cathode region, a first well of said second conductivity type formed adjacent to said channel region, a first source region of said first conductivity type having a high impurity concentration formed within said well, a first gate insulating film formed on a surface of said first well between said first source and first drain region, and a first MOS gate electrode formed above said first gate insulating film;

a second MOS transistor having a second drain region that is the same region as said gate region, a second well of said first conductivity type formed adjacent to said channel region, a second source region of said second conductivity type having high impurity concentration formed within said second well, a second gate insulating film formed on a surface of said second well region between said second source and second drain region, and a second MOS gate electrode formed above said second gate insulating film; and a voltage regulation element having a first semiconductor region of second conductivity type having a high impurity concentration, and a second semiconductor region of said first conductivity type;

wherein said SI thyristor unit, said first and second MOS transistors and said voltage regulation element are merged onto a single monolithic chip, wherein said first semiconductor region and said first and second source regions are connected to each other through a first wiring layer of high conductivity, and said second semiconductor region and said gate region are connected to each other through a second wiring layer of high conductivity, and wherein control voltage is applied to said first and second MOS gate electrodes, so that principal current flowing between said anode and cathode regions is controlled.

18. A MOS composite static induction thyristor comprising:

an SI thyristor unit having a cathode region of a first conductivity type having a high impurity concentration, an anode region and a gate region of a second conductivity type having a high impurity concentration, and a channel region of said first conductivity type having low impurity concentration;

a first MOS transistor having a first drain region that is the same region as said cathode region, a first base of said second conductivity type formed adjacent to said channel region, ad first source region of said first conductivity type having a high impurity concentration formed above said first base, a first gate insulating film formed on a surface of said first base region between said first source and first drain regions, and a first MOS gate electrode formed adjacent to said first gate insulating film;

a second MOS transistor having at least a second drain region that is the same region as said gate region, a second base of said first conductivity type formed adjacent to an upper portion of said second drain region, a second source region of said second conductivity type having a high impurity concentration formed above said second base, a second gate insulating film formed on a surface of said second base between said second source and second drain regions, and a second MOS gate electrode formed adjacent to said second gate insulating film; and a voltage regulation element having a first semiconductor region of second conductivity type having high impurity concentration, and a second semiconductor region of first conductivity type;

wherein said SI thyristor unit, said first and second MOS transistor and said voltage regulation element are merged onto a single monolithic chip, wherein said first conductivity region and said first and second source regions are connected to each other through a first wiring layer of high conductivity, and said second semiconductor region and said gate region are connected to each other through a second wiring layer of high conductivity, and wherein control voltage is applied to said first and second MOS gate electrodes, so that principal current flowing between said anode and cathode regions is controlled.

19. A MOS composite static induction thyristor according to any one of claims 1 to 15, 17 and 18, including a buffer layer of first conductivity type at a location adjacent to said anode region.

20. A MOS composite static induction thyristor according to any one of claims 1 to 15, 17 and 18, wherein said anode region is divided into a plurality of said sections, and a short region of first conductivity type having a high impurity concentration is formed between the divided sections of said anode region.

21. A MOS composite static induction thyristor according to claim 20, including a buffer layer of said first conductivity type at a location adjacent to said anode region.

22. A MOS composite static induction thyristor according to any one of claims 1 to 15, 17 and 18, wherein said anode region is divided into a plurality of regions arranged cyclically, a short region of first conductivity type having a high impurity concentration is formed between the divided anode regions, and a repeated pitch of said plurality of regions arranged cyclically no more than two times a diffusion length of a carrier having said first conductivity type.

23. A MOS composite static induction thyristor according to claim 22, including a buffer layer of said first conductivity type at a location adjacent to said anode region.